(12) United States Patent
Kim et al.

(10) Patent No.: US 12,406,870 B2
(45) Date of Patent: Sep. 2, 2025

(54) DEPOSITION MASK STAGE, DISPLAY MANUFACTURING APPARATUS INCLUDING THE SAME, AND DISPLAY MANUFACTURING METHOD USING THE SAME

(71) Applicant: Samsung Display Co., Ltd., Yongin-si (KR)

(72) Inventors: Euigyu Kim, Suwon-si (KR); Sang Min Yi, Seoul (KR); Junhyeuk Ko, Yongin-si (KR); Jongbum Kim, Yongin-si (KR); Jaesuk Moon, Seongnam-si (KR); Hong-Kyun Ahn, Hwaseong-si (KR); Kyunghoon Chung, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 206 days.

(21) Appl. No.: 18/104,453

(22) Filed: Feb. 1, 2023

(65) Prior Publication Data

US 2023/0317492 A1   Oct. 5, 2023

(30) Foreign Application Priority Data

Mar. 29, 2022   (KR) .......................... 10-2022-0039122

(51) Int. Cl.
  *H01T 23/00*   (2006.01)
  *H01L 21/683*   (2006.01)
(52) U.S. Cl.
  CPC ................ *H01L 21/6833* (2013.01)

(58) Field of Classification Search
  None
  See application file for complete search history.

(56) References Cited

U.S. PATENT DOCUMENTS

| | | | |
|---|---|---|---|
| 9,039,478 | B2 | 5/2015 | Kim et al. |
| 9,847,485 | B2 * | 12/2017 | Min ...................... C23C 14/042 |
| 10,072,328 | B2 | 9/2018 | Ghosh et al. |
| 10,141,511 | B2 * | 11/2018 | Kim ...................... H10K 71/166 |
| 11,038,155 | B2 | 6/2021 | Ogata et al. |
| 11,275,315 | B2 * | 3/2022 | Ghosh ...................... G03F 7/707 |
| 2014/0165906 | A1 | 6/2014 | Grant et al. |
| 2018/0363127 | A1 | 12/2018 | Bucci et al. |
| 2020/0168800 | A1 * | 5/2020 | Lee ...................... H10K 71/166 |
| 2023/0189625 | A1 * | 6/2023 | Kim ...................... H10K 71/00 |
| | | | 257/40 |

FOREIGN PATENT DOCUMENTS

| | | |
|---|---|---|
| JP | 6548856 | 7/2019 |
| JP | 2021-175823 | 11/2021 |
| KR | 10-1411249 | 6/2014 |
| KR | 10-2019-0026676 | 3/2019 |
| KR | 10-1969955 | 4/2019 |
| KR | 10-2021-0055600 | 5/2021 |
| KR | 10-2021-0126147 | 10/2021 |

* cited by examiner

*Primary Examiner* — Stephen W Jackson
(74) *Attorney, Agent, or Firm* — Lerner David LLP

(57) ABSTRACT

Disclosed is a deposition mask stage comprising a stage frame, chucks combined with the stage frame, and support blocks on a back side of the stage frame. The chucks are spaced apart from each other in a first direction and a second direction that are defined in an extending direction of the stage frame. The first and second directions intersect each other. The support blocks are spaced apart from each other in the first direction and the second direction on the back side of the stage frame.

20 Claims, 23 Drawing Sheets

DEPOSITION MASK STAGE, DISPLAY MANUFACTURING APPARATUS INCLUDING THE SAME, AND DISPLAY MANUFACTURING METHOD USING THE SAME

CROSS-REFERENCE TO RELATED APPLICATION(S)

This U.S. nonprovisional application claims priority to and benefits of Korean Patent Application No. 10-2022-0039122 under 35 U.S.C. § 119, filed on Mar. 29, 2022 in the Korean Intellectual Property Office, the entire contents of which are herein incorporated by reference.

BACKGROUND

1. Technical Field

The disclosure relates to a deposition mask stage, a display manufacturing apparatus including the same, and a display manufacturing method using the same.

2. Description of the Related Art

Electronic products, such as smart phones, digital cameras, laptop computers, navigation systems, and smart televisions, include a display device for displaying an image. The display device generates an image and provides users with the image displayed on a display screen.

A display device may be manufactured through various processes. For example, a deposition process may be employed in the procedure for fabricating the display device. In the deposition process for fabricating the display device, a fine metal mask (FMM), in close contact with a substrate, may be used to deposit an organic material. A mask frame may be utilized to allow the fine metal mask to contact the substrate.

SUMMARY

An embodiment of the disclosure provides a deposition mask stage capable of controlling deformation of a mask frame, a display manufacturing apparatus including the same, and a display manufacturing method using the same.

According to an embodiment of the disclosure, a deposition mask stage may include a stage frame, chucks combined with the stage frame, and support blocks on a back side of the stage frame. The chucks may be spaced apart from each other in a first direction and a second direction that may be defined in an extending direction of the stage frame. The first and second directions may intersect each other. The support blocks may be spaced apart from each other in the first direction and the second direction on the back side of the stage frame.

In an embodiment, each of the chucks may include a permanent magnetic chuck.

In an embodiment, the deposition mask stage may further include a position adjustment device combined with each of the support blocks. The position adjustment device may adjust a position of each of the support blocks.

In an embodiment, each of the chucks may be spaced apart from each of the support blocks.

In an embodiment, each of the chucks may be disposed on the back side of the stage frame.

In an embodiment, a distance between a back side of each of the support blocks and the back side of the stage frame may be greater than a distance between a back side of each of the chucks and the back side of the stage frame.

According to an embodiment of the disclosure, a display manufacturing apparatus may include a deposition source, and a deposition mask stage spaced apart from the deposition source. The deposition mask stage may include a stage frame, and at least one chuck physically connected to the stage frame.

In an embodiment, the at least one chuck may be disposed opposite to the deposition source with the stage frame between the at least one chuck and the deposition source.

In an embodiment, the deposition mask stage may be spaced in a horizontal direction from the deposition source.

In an embodiment, the at least one chuck may include a plurality of chucks. The plurality of chucks may be spaced apart from each other in direction that intersects the horizontal direction.

In an embodiment, the deposition mask stage may further include a support block physically connected to the stage frame. The stage frame may have a front side directed toward the deposition source and a back side opposite to the front side. The support block may be disposed on the back side of the stage frame.

In an embodiment, the at least one chuck may include a permanent magnetic chuck.

In an embodiment, the display manufacturing apparatus may further include a chuck power supply that supplies the permanent magnetic chuck with power.

According to an embodiment of the disclosure, a display manufacturing method may include loading a substrate on a display manufacturing apparatus, and using a deposition source of the display manufacturing apparatus to perform a deposition process on the substrate. The loading of the substrate on the display manufacturing apparatus may include placing the substrate on a deposition mask stage of the display manufacturing apparatus, and using at least one chuck of the deposition mask stage to fix the substrate to the deposition mask stage. The placing of the substrate on the deposition mask stage may include allowing a deposition mask to contact the deposition mask stage such that a front side of the substrate faces toward the deposition source. The deposition mask may be physically connected to the front side of the substrate.

In an embodiment, the at least one chuck may include a plurality of chucks. The fixing of the substrate to the deposition mask stage may include turning on at least one of the plurality of chucks and turning off remaining ones of the plurality of chucks.

In an embodiment, the substrate manufacturing method may further include determining whether each of the plurality of chucks is turned off.

In an embodiment, the determining whether each of the plurality of chucks is turned off may include classifying types of the deposition mask, and determining which of the plurality of chucks is turned off for each type of the deposition mask.

In an embodiment, the deposition mask stage may include a stage frame, and a support block on a back side of the stage frame. The allowing of the deposition mask to contact the deposition mask stage may include allowing a front side of the deposition mask to contact a back side of the support block.

In an embodiment, the loading of the substrate on the display manufacturing apparatus may include adjusting a distance between the back side of the support block and the back side of the stage frame.

In an embodiment, the placing of the substrate on the deposition mask stage may include transferring the substrate into a chamber of the display manufacturing apparatus in a state that a back side of the substrate may be fixed to a support plate.

DETAILED DESCRIPTION OF THE EMBODIMENTS

Figure 1:
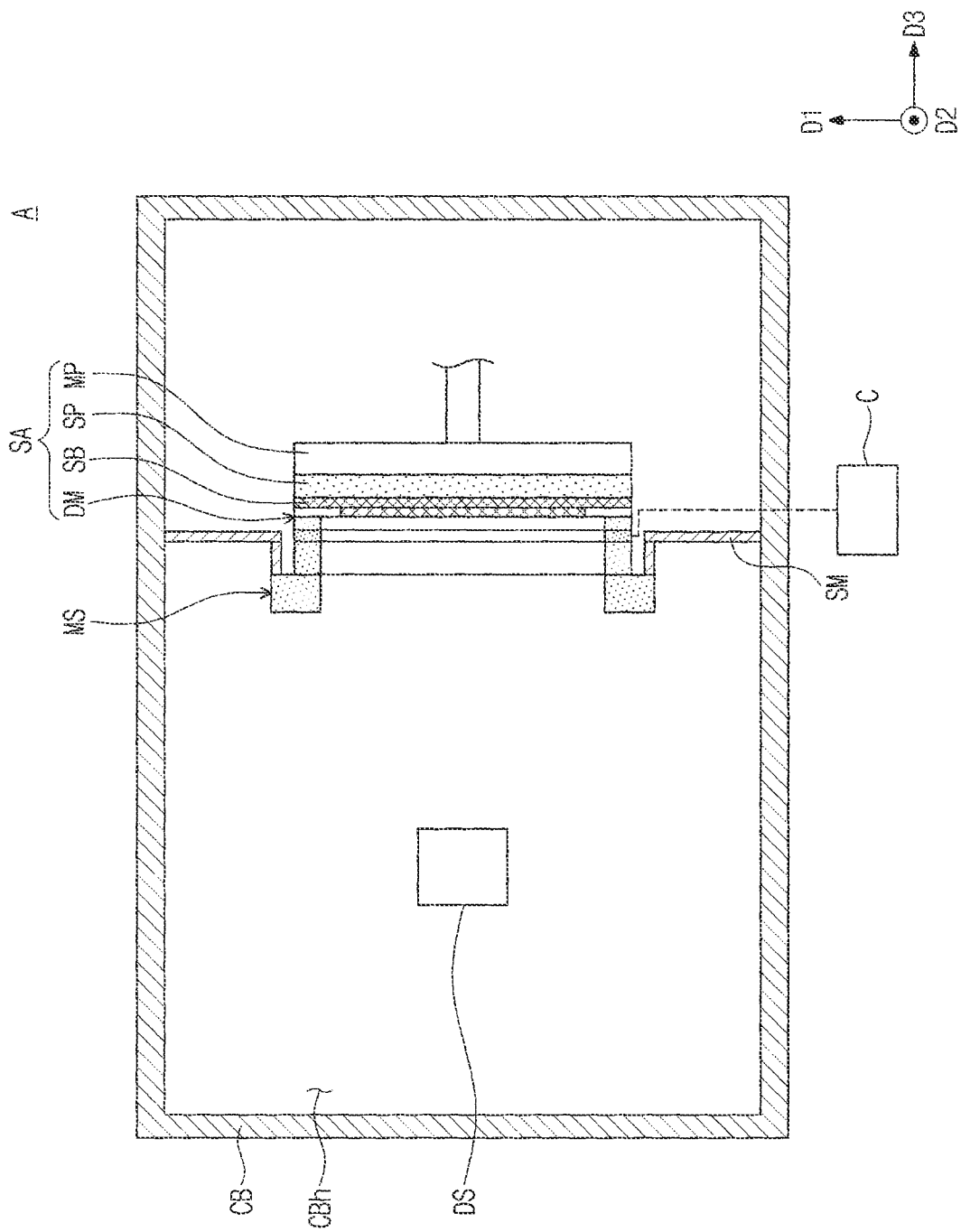
FIG. 1 schematically illustrates a cross-sectional view showing a display manufacturing apparatus according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this description, when a certain component (or region, layer, portion, etc.) is referred to as being "on", "connected to", or "coupled to" other component(s), the certain component may be directly on, directly connected to, or directly coupled to the other component(s) or at least one intervening component may be therebetween. It will be understood that the terms "connected to" or "coupled to" may include a physical or electrical connection or coupling.

Like numerals indicate like components. Moreover, in the drawings, thicknesses, ratios, and dimensions of components may be exaggerated for effectively explaining the technical contents.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

It will be understood that, although the terms first, second, etc. may be used herein to describe various components, these components should not be limited by these terms. These terms are only used to distinguish one component from another component. For example, a first component could be termed a second component, and vice versa without departing from the scope of the disclosure. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

With reference to drawings, the following will describe a deposition mask stage according to embodiments of the disclosure, a display manufacturing apparatus including the same, and a display manufacturing method using the same.

FIG. 1 schematically illustrates a cross-sectional view showing a display manufacturing apparatus according to an embodiment of the disclosure.

In this description, symbol D1 may indicate a first direction, symbol D2 may indicate a second direction that intersects the first direction D1, and symbol D3 may indicate a third direction that intersects each of the first and second directions D1 and D2. The first direction D1 may also be called a vertical direction. Each of the second and third directions D2 and D3 may also be called a horizontal direction. The third direction D3 may also be called a backward direction, and a direction opposite to the third direction D3 may also be called a forward direction.

Referring to FIG. 1, a display manufacturing apparatus A may be provided. The display manufacturing apparatus A may be an apparatus to perform a deposition process. For example, the display manufacturing apparatus A may mean an apparatus in which a deposition process may be performed on a mother glass substrate. The mother glass substrate may indicate a substrate on which multiple display panels may be formed. The disclosure, however, is not limited thereto, and the display manufacturing apparatus A may be configured such that a deposition process may be performed on a different kind of substrate. The display manufacturing apparatus A may include a chamber CB, a deposition source DS, a deposition mask stage MS, a support bar SM, and a controller C. A substrate assembly SA may be disposed in the display manufacturing apparatus A during process.

The chamber CB may define a process space CBh. The process space CBh may be separated from outside. During process, the process space CBh may be maintained in a substantial vacuum state. A vacuum pump (not shown) may be provided which may be physically and/or fluidly connected to the process space CBh. In a state that a substrate SB is disposed in the process space CBh, a deposition process may be performed on the substrate SB.

The deposition source DS may be positioned within the chamber CB. For example, the deposition source DS may be disposed in the process space CBh. The deposition source DS may be directed toward a front side of the substrate SB. The deposition source DS may include a deposition material which may be deposited on the substrate SB. In an embodiment, an organic material may be adopted as the deposition material which may be deposited on the substrate SB. The deposition source DS may spray the deposition material. For example, during process, the deposition material introduced from the deposition source DS may be deposited on the front side of the substrate SB. The deposition source DS may include a linear deposition source that extends in a direction, but the disclosure is not limited thereto. The deposition source DS may be movable. For example, during process, the deposition source DS may move in the first direction D1 and/or the second direction D2. Differently from that shown, multiple deposition sources DS may be provided. Each of the deposition sources DS may be disposed toward the front side of the substrate SB. For convenience, the following will describe a single deposition source DS.

During a deposition process, the deposition mask stage MS may support a deposition mask DM. The deposition mask stage MS may support the substrate assembly SA that includes the substrate SB. For example, the deposition mask stage MS may rigidly place the substrate SB in a certain position within the chamber CB. For more detail, the deposition mask stage MS may fix the substrate SB to a certain position so as to cause the front side of the substrate SB to face toward the deposition source DS. The deposition mask stage MS may control a shape of the deposition mask DM. A detailed description thereof will be further discussed below.

The deposition mask stage MS may be disposed spaced apart from the deposition source DS. For example, the deposition mask stage MS may be spaced apart in a horizontal direction from the deposition source DS. As shown in FIG. 1, the deposition mask stage MS may be spaced apart in the third direction D3 from the deposition source DS. In this sense, the display manufacturing apparatus A according to an embodiment may be vertical deposition apparatus. The disclosure, however, is not limited thereto, and the deposition mask stage MS may be spaced apart in a vertical direction from the deposition source DS. In this sense, the display manufacturing apparatus A according to an embodiment may be horizontal deposition apparatus. The deposition mask stage MS will be further discussed in detail below.

The support bar SM may support the deposition mask stage MS. For example, the support bar SM may rigidly place the deposition mask stage MS in a certain position within the chamber CB. As shown in FIG. 1, the support bar SM may connect and fix the deposition mask stage MS to the chamber CB.

The controller C may control the deposition mask stage MS and/or the deposition source DS. For example, the controller C may control the deposition mask stage MS so as to correct a shape of the substrate SB. In other embodiments, the controller C may control a position and a temperature of the deposition source DS.

During process, the substrate assembly SA may be disposed in the chamber CB. The deposition mask stage MS may fix the substrate assembly SA to a certain position. For example, the deposition mask stage MS may provide a magnetic force through which the substrate assembly SA may be fixed to a certain position in the chamber CB. The substrate assembly SA may include a deposition mask DM, a substrate SB, a support plate SP, and a fixing plate MP. A detailed description thereof will be further discussed below.

Figure 2:
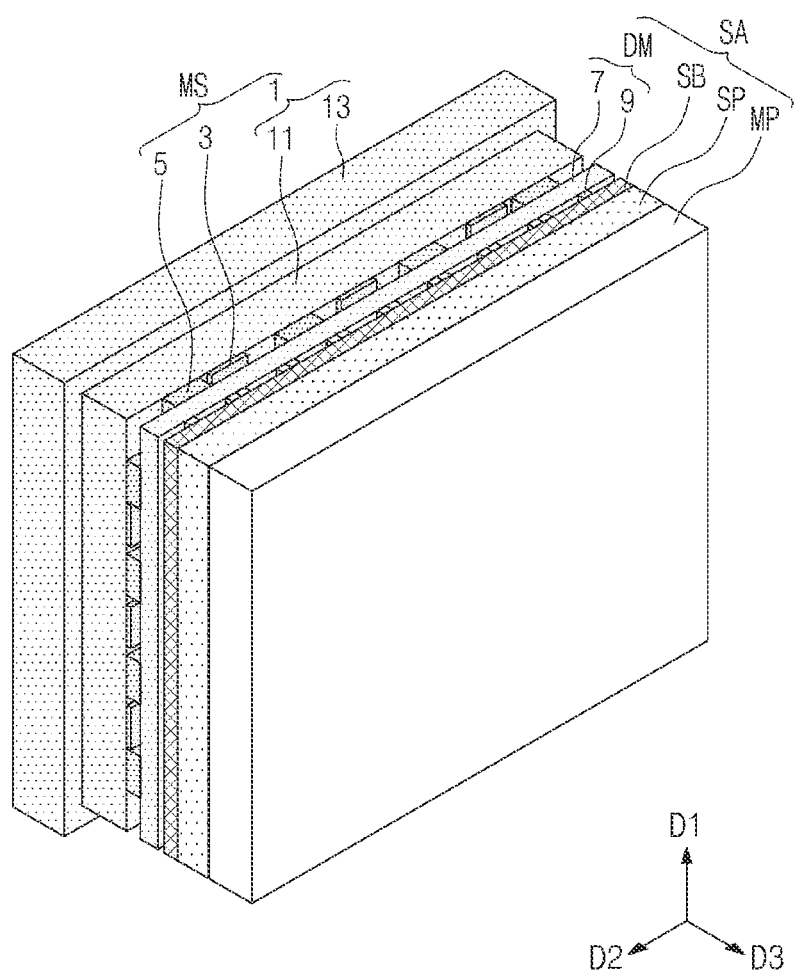
FIG. 2 schematically illustrates a perspective view partially showing a display manufacturing apparatus according to an embodiment of the disclosure.
Figure 3:
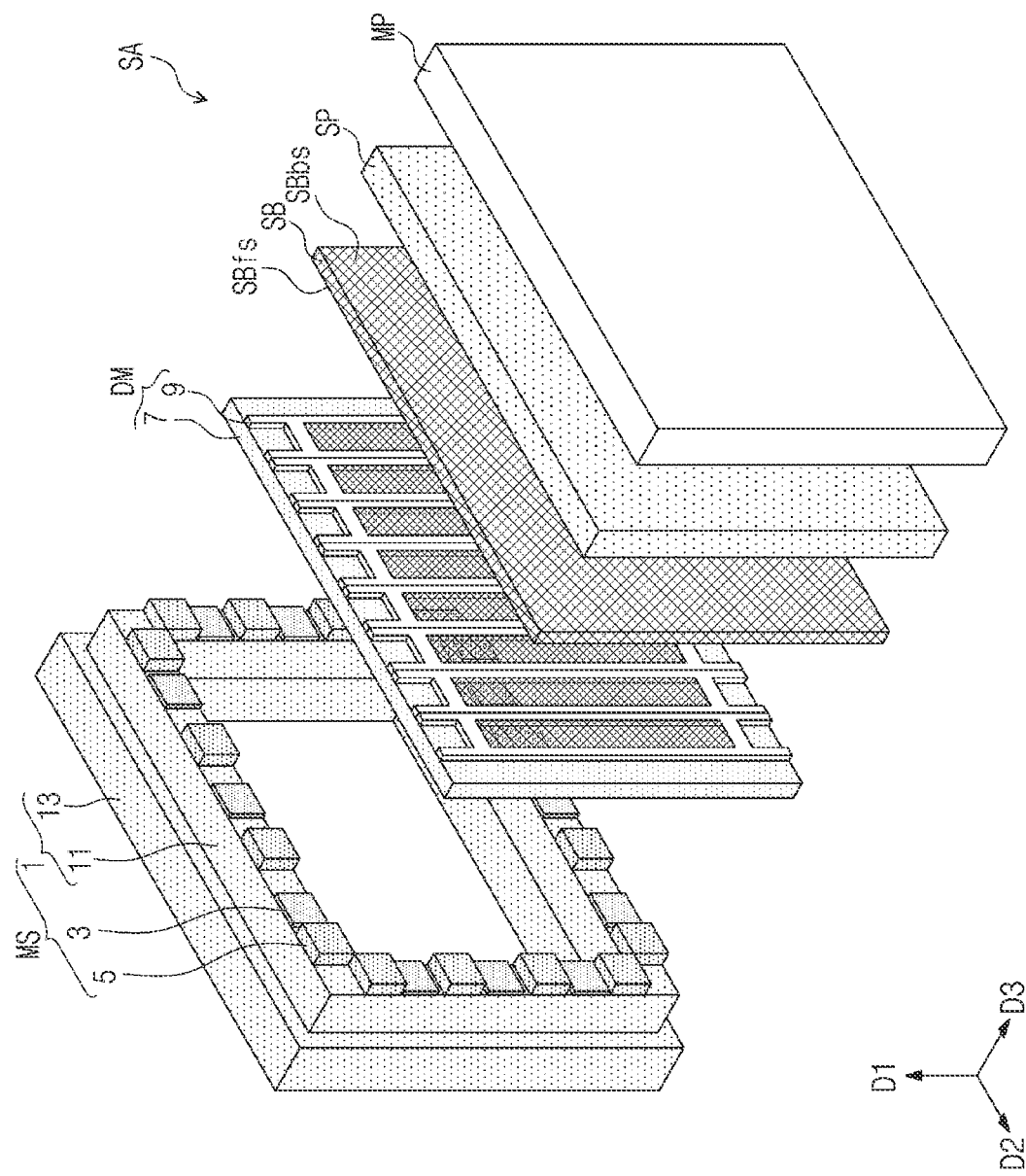
FIG. 3 schematically illustrates an exploded perspective view partially showing a display manufacturing apparatus according to an embodiment of the disclosure.
Figure 4:
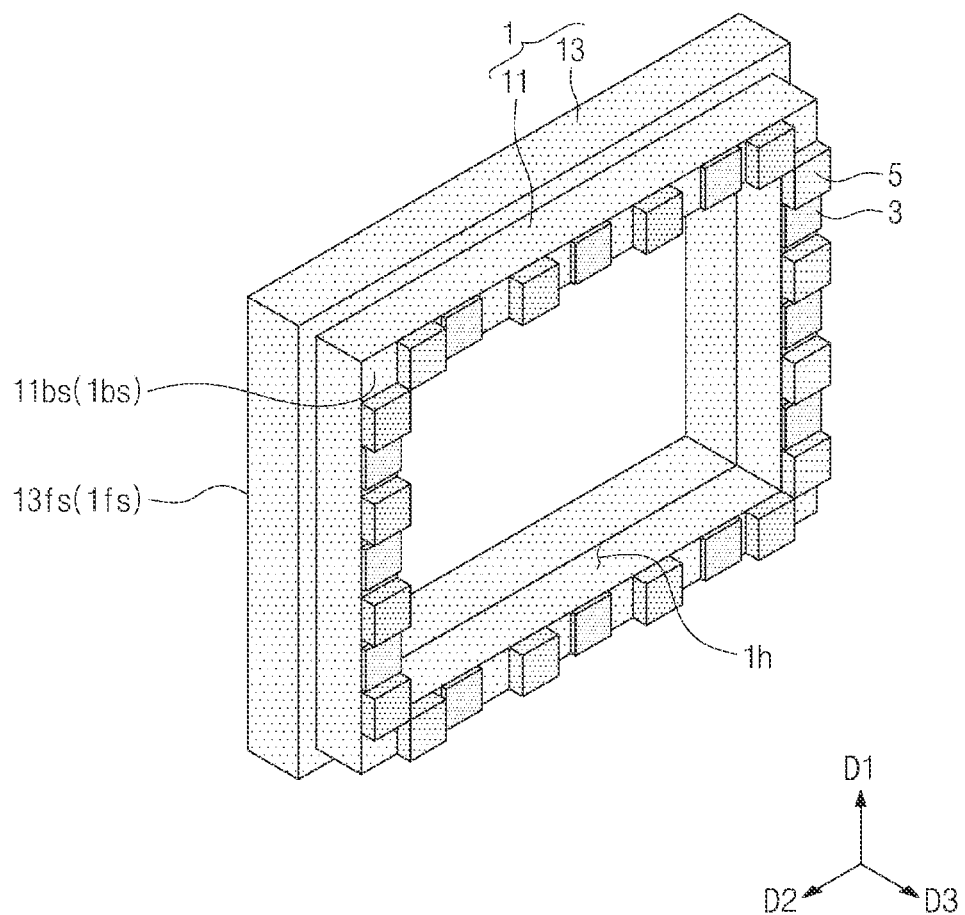
FIG. 4 schematically illustrates a perspective view showing a deposition mask stage according to an embodiment of the disclosure.
Figure 5:
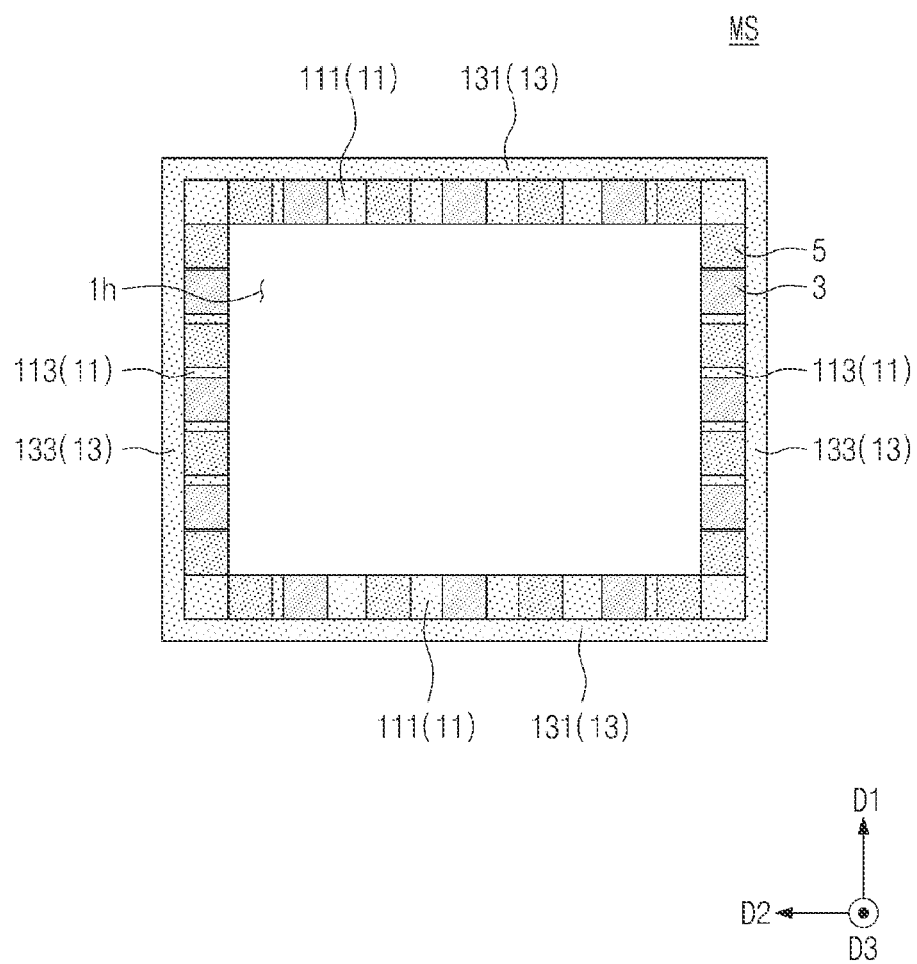
FIG. 5 schematically illustrates a bottom view showing a deposition mask stage according to an embodiment of the disclosure.
Figure 6:
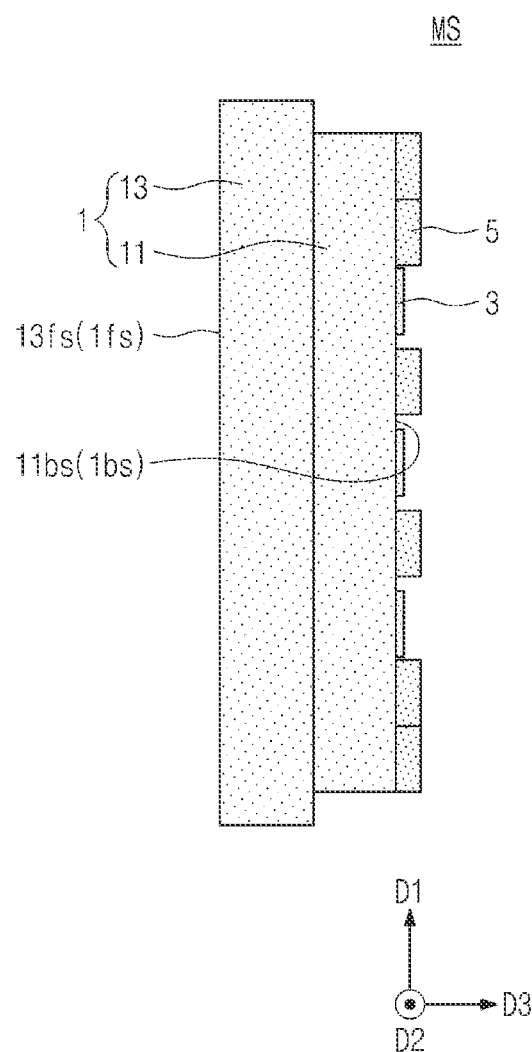
FIG. 6 schematically illustrates a side view showing a deposition mask stage according to an embodiment of the disclosure.

FIG. 2 schematically illustrates a perspective view partially showing a display manufacturing apparatus according to an embodiment of the disclosure. FIG. 3 schematically illustrates an exploded perspective view partially showing a display manufacturing apparatus according to an embodiment of the disclosure. FIG. 4 schematically illustrates a perspective view showing a deposition mask stage according to an embodiment of the disclosure. FIG. 5 schematically illustrates a bottom view showing a deposition mask stage according to an embodiment of the disclosure. FIG. 6 schematically illustrates a side view showing a deposition mask stage according to an embodiment of the disclosure.

Referring to FIGS. 2 and 3, the deposition mask stage MS may include a stage frame 1, a chuck 3, and a support block 5.

Referring to FIGS. 2 to 6, the stage frame 1 may extend along a plane defined by the first direction D1 and the second direction D2. For example, a normal line of the stage frame 1 may be parallel to the third direction D3. The stage frame 1 may define a deposition space $1h$. The deposition space $1h$ may extend in the third direction D3 so as to connect a front side ifs of the stage frame 1 to a back side $1bs$ of the stage frame 1. The stage frame 1 may include metal. For example, the stage frame 1 may include a stainless steel (SUS). The disclosure, however, is not limited thereto, and the stage frame 1 may include any other rigid material.

The stage frame 1 may include a first frame 11 and a second frame 13. The first frame 11 may be physically connected to a back side of the second frame 13. For example, the first frame 11 may be positioned in the third direction D3 away from the second frame 13. A back side $11bs$ of the first frame 11 may correspond to the back side $1bs$ of the stage frame 1. A front side $13fs$ of the second frame 13 may correspond to the front side Ifs of the stage frame 1. The first frame 11 may be smaller than the second frame 13, but the disclosure is not limited thereto.

Referring to FIG. 5, the stage frame 1 may have a tetragonal annular shape. The deposition space 1*h* defined by the stage frame 1 may have a tetragonal shape. The first frame 11 may include two first horizontal bars 111 and two first vertical bars 113. Each of the two first horizontal bars 111 may extend in the second direction D2. The two first horizontal bars 111 may be spaced apart from each other in the first direction D1. Each of the two first vertical bars 113 may extend in the first direction D1. The two first vertical bars 113 may be spaced apart from each other in the second direction D2. Each of the two first vertical bars 113 may be physically connected to the two first horizontal bars 111. The second frame 13 may include two second horizontal bars 131 and two second vertical bars 133. Each of the two second horizontal bars 131 may extend in the second direction D2. The two second horizontal bars 131 may be spaced apart from each other in the first direction D1. Each of the two second vertical bars 133 may extend in the first direction D1. The two second vertical bars 133 may be spaced apart from each other in the second direction D2. Each of the two second vertical bars 133 may be physically connected to the two second horizontal bars 131. It may be expressed that the stage frame 1 extends in the first direction D1 and the second direction D2. For example, an extending direction of the stage frame 1 may be the first and second directions D1 and D2.

The stage frame 1 is shown and described to have a tetragonal annular shape, but the disclosure is not limited thereto. For example, the stage frame 1 may have a circular annular shape or any other suitable shape.

Referring back to FIGS. 4 to 6, the chuck 3 may be combined with the stage frame 1. In an embodiment, the chuck 3 may be connected to the stage frame 1 so as to stand (be disposed) opposite to the deposition source (see DS of FIG. 1) with the stage frame 1 between the chuck 3 and the deposition source DS. For example, the chuck 3 may be positioned on the back side lbs of the stage frame 1. In other embodiments, at least a portion of the chuck 3 may be disposed on a position that may be inwardly recessed from the back side 1*bs* of the stage frame 1.

The chuck 3 may fix the deposition mask DM disposed on the deposition mask stage MS. The chuck 3 may provide a fixing force that fixes the deposition mask DM. For example, the chuck 3 may use a magnetic force to fix the deposition mask DM to the deposition mask stage MS. The chuck 3 may include a magnetic chuck. For example, the chuck 3 may include a permanent magnetic chuck. For example, the chuck 3 may include a permanent magnet. In a state that the chuck 3 is provided with no voltage, the chuck 3 may use a magnetic force to fix the deposition mask DM. In contrast, in case that a voltage is applied to the chuck 3, the magnetic force provided from the chuck 3 may disappear. The disclosure, however, is not limited thereto. For example, the chuck 3 may include an electromagnetic magnet. In a state that the chuck 3 is provided with voltage, the chuck 3 may use a magnetic force to fix the deposition mask DM. In contrast, in a state that the chuck 3 is provided with no voltage, the magnetic force provided from the chuck 3 may disappear. In other embodiments, the chuck 3 may include a different component. For example, the chuck 3 may include an electrostatic chuck (ESC).

Multiple chucks 3 may be provided. The chucks 3 may be disposed spaced apart from each other. The chucks 3 may be spaced apart from each other along (in) an extending direction of the stage frame 1. For example, the chucks 3 may be disposed apart from each other along the first direction D1 and/or the second direction D2. One or more chucks 3 may be disposed spaced apart from one or more other chucks 3 along the second direction D2 on the two first horizontal bars 111. Remaining chucks 3 may be disposed spaced apart from each other along the first direction D1 on the two first vertical bars 113. The number of the chucks 3 may be twelve as shown in FIG. 5. The disclosure, however, is not limited thereto, and the number and arrangement of the plurality of chucks 3 may be differently determined if necessary. Unless otherwise indicated herein, a single chuck 3 will be discussed in the interest of convenience.

The support block 5 may be combined with the stage frame 1. In an embodiment, the support block 5 may be connected to the stage frame 1 so as to stand opposite to the deposition source (see DS of FIG. 1) with stage frame 1 between the support block 5 and the deposition source DS. For example, the support block 5 may be positioned on the back side 1*bs* of the stage frame 1. In other embodiments, at least a portion of the support block 5 may be disposed on a position that may be inwardly recessed from the back side 1*bs* of the stage frame 1. A detailed description thereof will be further discussed below.

The support block 5 may be in direct contact with the deposition mask DM that may be fixed to the deposition mask stage MS. The support block 5 may support the deposition mask DM. In an embodiment, the support block 5 may have a rectangular hexahedral shape, but the disclosure is not limited thereto. The support block 5 may include a different material from that of the stage frame 1. For example, the support block 5 may include a plastic resin material. The disclosure, however, is not limited thereto, and the support block 5 may include the same material as that of the stage frame 1.

The support block 5 may be spaced apart from the chuck 3. For example, the support block 5 and the chuck 3 may be spaced apart from each other in the first direction D1 and/or the second direction D2. In other embodiments, the support block 5 may overlap the chuck 3. The support block 5 may stand behind the chuck 3. In this configuration, the support block 5 may be positioned on a back side of the chuck 3.

Multiple support blocks 5 may be provided. The support blocks 5 may be disposed spaced apart from each other. The support blocks 5 may be spaced apart from each other along an extending direction of the stage frame 1. For example, the support blocks 5 may be disposed spaced apart from each other along the first direction D1 and/or the second direction D2. One or more support blocks 5 may be disposed spaced apart from each other along the second direction D2 on the two first horizontal bars 111. Remaining support blocks 5 may be disposed spaced apart from each other along the first direction D1 on the two first vertical bars 113. Each of the support blocks 5 may be spaced apart from each of the chucks 3. For example, as shown in FIG. 5, each of the chucks 3 may be positioned between two neighboring support blocks 5. The number of the support blocks 5 may be sixteen as shown in FIG. 5. The disclosure, however, is not limited thereto, and the number and arrangement of the support blocks 5 may be differently determined if necessary. Unless otherwise indicated herein, a single support block 5 will be discussed in the interest of convenience.

Referring back to FIG. 3, the deposition mask DM may be fixed to the deposition mask stage MS. The deposition mask DM may include a mask frame 7 and a unit mask 9. A detailed description thereof will be further discussed below with reference to FIGS. 10 and 11.

The substrate SB may be positioned between the deposition mask DM and the support plate SP. The substrate SB may include a mother glass substrate used for display fabrication, but the disclosure is not limited thereto. A front side SBfs of the substrate SB may contact the deposition mask DM. A back side SBbs of the substrate SB may contact the support plate SP.

The support plate SP may contact the back side SBbs of the substrate SB. The support plate SP may support the substrate SB.

The fixing plate MP may contact a back side of the support plate SP. The fixing plate MP may provide a fixing force to rigidly place the deposition mask DM. The fixing plate MP may include a magnet. The magnetic force provided from the fixing plate MP may fix the deposition mask DM to the fixing plate MP. Therefore, one or both of the substrate SB and the support plate SP may be fixed between the deposition mask DM and the fixing plate MP. For example, the fixing plate MP may fix the substrate assembly SA as one body.

Figure 7:
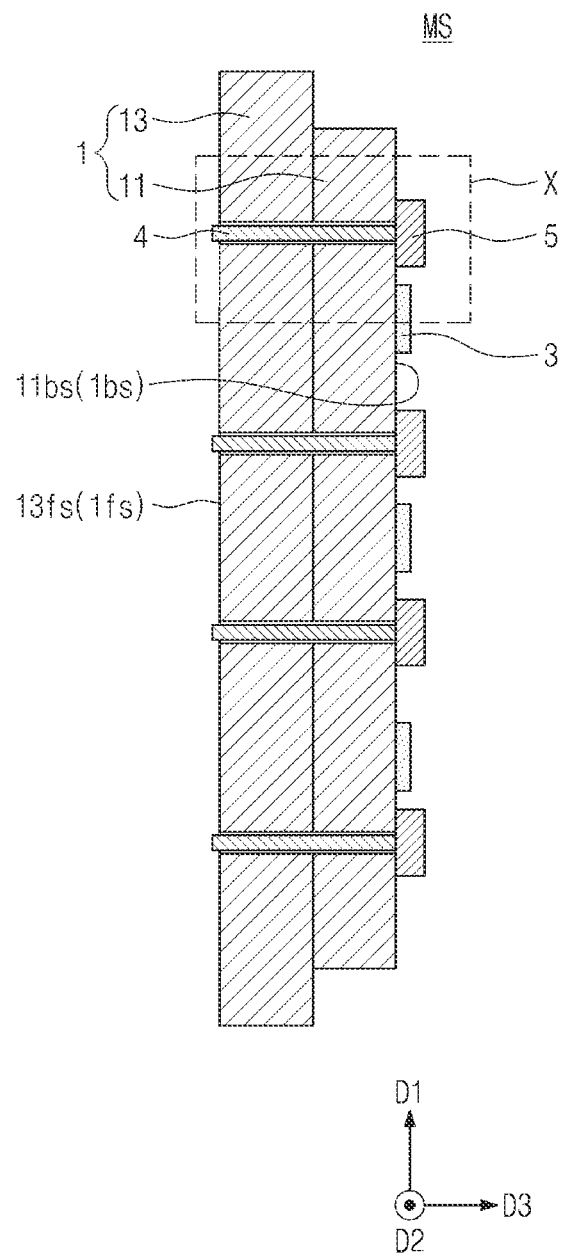
FIG. 7 schematically illustrates a cross-sectional view showing a deposition mask stage according to an embodiment of the disclosure.
Figure 8:
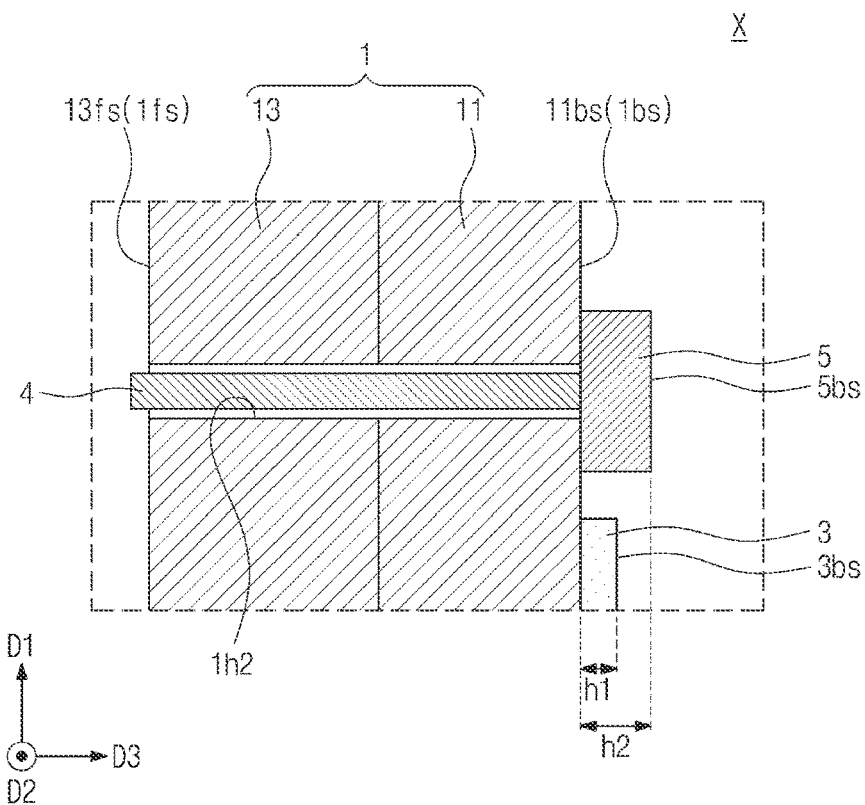
FIGS. 8 and 9 schematically illustrate enlarged cross-sectional views showing section X of FIG. 7.
Figure 9:
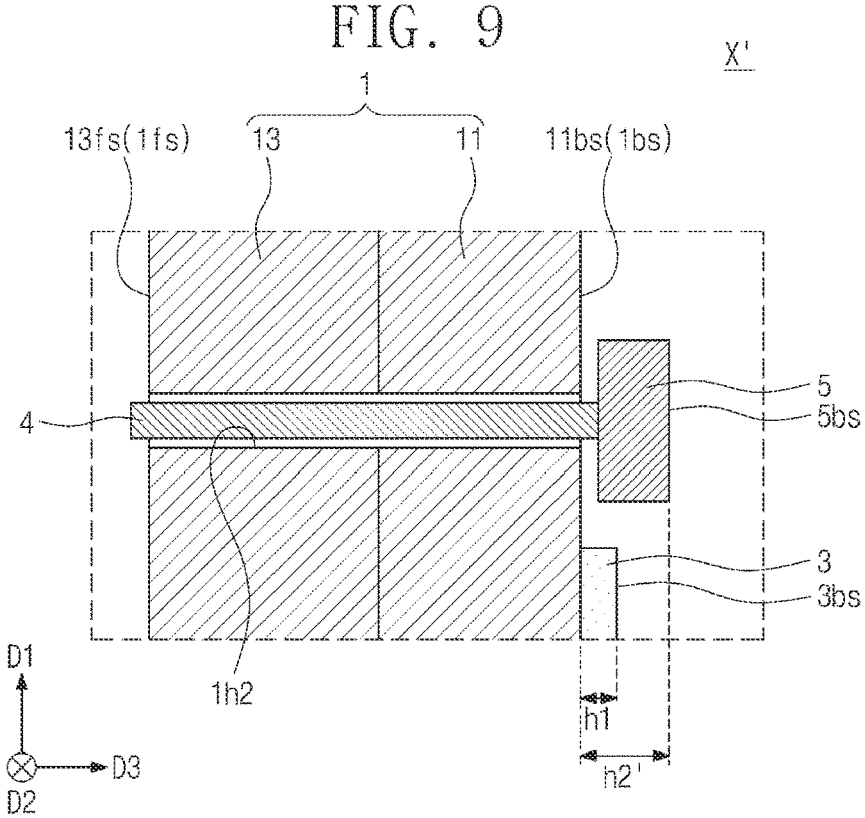

FIG. 7 schematically illustrates a cross-sectional view showing a deposition mask stage according to an embodiment of the disclosure. FIGS. 8 and 9 schematically illustrate enlarged cross-sectional views showing section X (X and X') of FIG. 7.

Referring to FIGS. 7 and 8, the deposition mask stage MS may further include a position adjustment device 4. The position adjustment device 4 may adjust a position of the support block 5. The position adjustment device 4 may be physically connected to a front side of the support block 5. The position adjustment device 4 may penetrate the stage frame 1. For example, the position adjustment device 4 may be inserted into an adjustment through hole 1h2 defined by the stage frame 1. The position adjustment device 4 may be used to adjust a position of the support block 5. The position adjustment device 4 may include an adjustment screw, but the disclosure is not limited thereto. In case that multiple support blocks 5 may be provided, multiple position adjustment devices 4 may also be provided. A single position adjustment device 4 will be discussed below in the interest of convenience.

A back side 3bs of the chuck 3 may stand behind the back side 1bs of the Stage Frame 1. For example, the back side 3bs of the chuck 3 may be spaced apart in the third direction D3 at a first distance h1 from the back side 1bs of the stage frame 1. A back side 5bs of the support block 5 may stand behind the back side 1bs of the stage frame 1. For example, the back side 5bs of the support block 5 may be spaced apart in the third direction D3 at a second distance h2 from the back side 1bs of the stage frame 1. The second distance h2 may be greater the first distance h1. The back side 5bs of the support block 5 may stand behind the back side 3bs of the chuck 3.

Referring to FIG. 9, the position adjustment device 4 may be used to adjust a position of the support block 5. For example, the position adjustment device 4 may rotate to separate the support block 5 from the back side 1bs of the stage frame 1. A third distance h2' may be provided as an interval between the back side 5bs of the support block 5 and the back side 1bs of the stage frame 1. The third distance h2' may be greater than the second distance h2 discussed with reference to FIG. 8.

Figure 10:
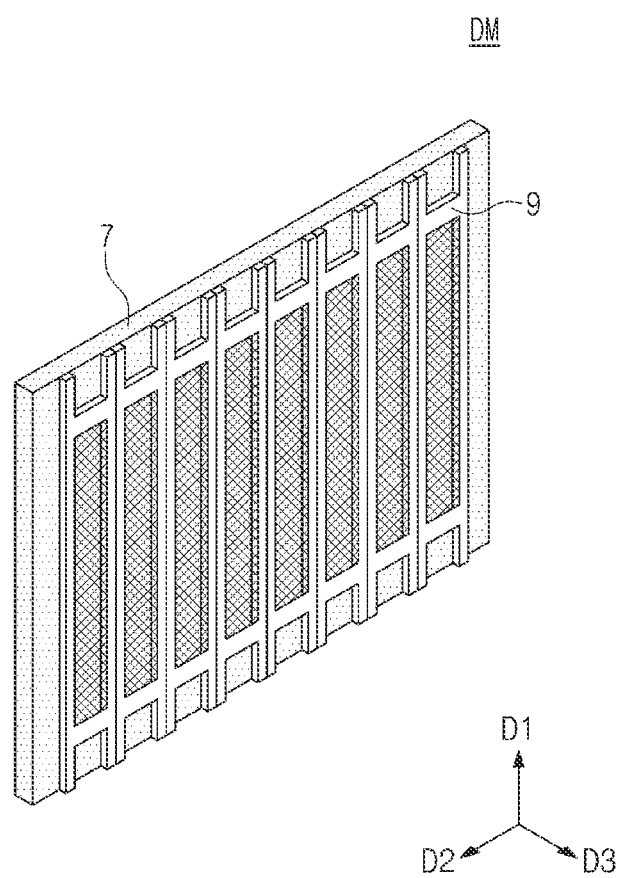
FIG. 10 schematically illustrates a perspective view showing a deposition mask according to an embodiment of the disclosure.
Figure 11:
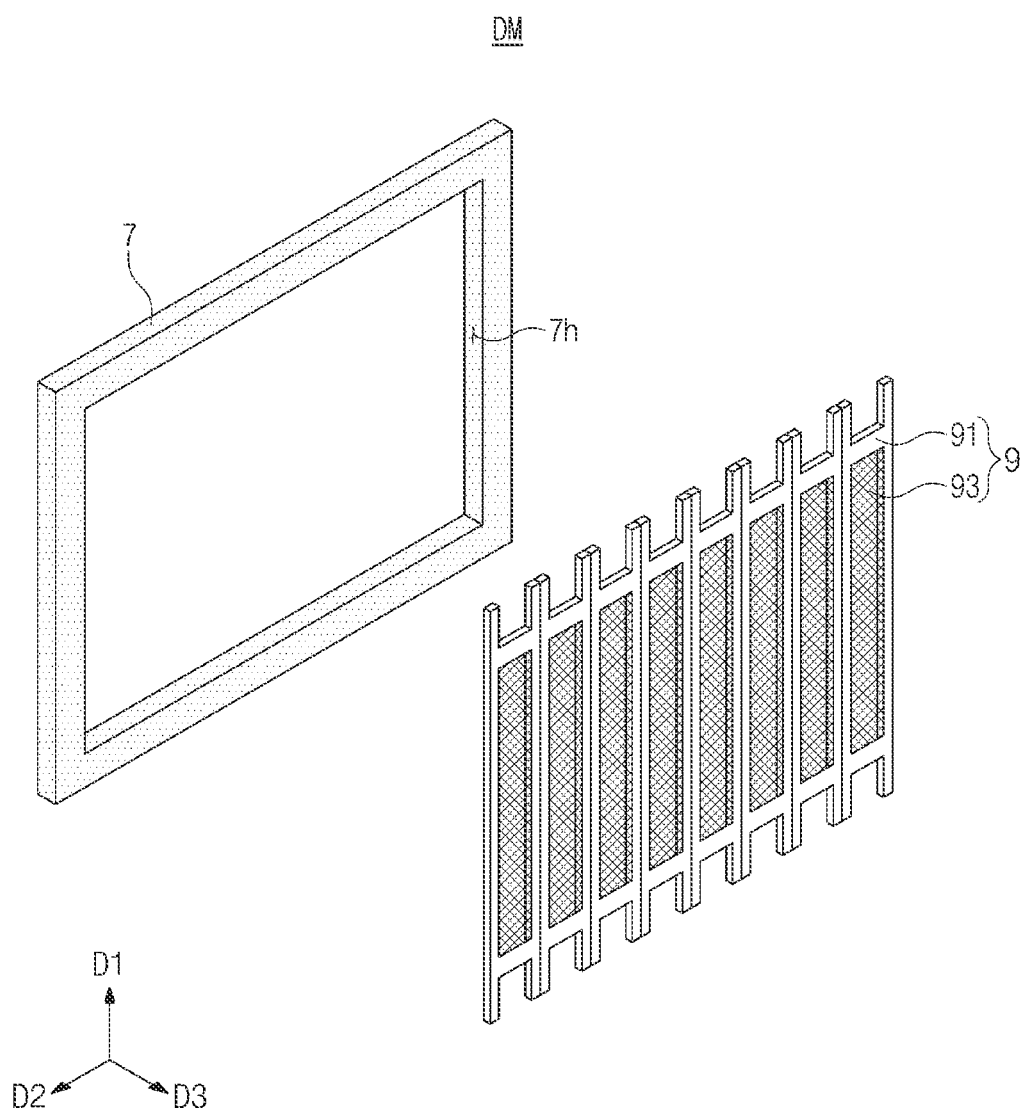
FIG. 11 schematically illustrates an exploded perspective view showing a deposition mask according to an embodiment of the disclosure.

FIG. 10 schematically illustrates a perspective view showing a deposition mask according to an embodiment of the disclosure. FIG. 11 schematically illustrates an exploded perspective view showing a deposition mask according to an embodiment of the disclosure.

Referring to FIGS. 10 and 11, the mask frame 7 may support the unit mask 9. The mask frame 7 may penetrate a through hole 7h. The mask frame 7 may include a metallic material. For example, the mask frame 7 may include an Invar alloy. The unit mask 9 may include a fine metal mask (FMM). The unit mask 9 may include a unit mask frame 91 and a mask body 93. The unit mask frame 91 may fix the mask body 93 to the mask frame 7. The mask body 93 may include a deposition pattern. A deposition material may be patterned while passing through the mask body 93, thereby being deposited on the substrate (see SB of FIG. 3). In an embodiment, multiple unit masks 9 may be provided in plural. The unit masks 9 may be arranged in the second direction D2. A single unit mask 9 will be discussed below in the interest of convenience.

Figure 12:
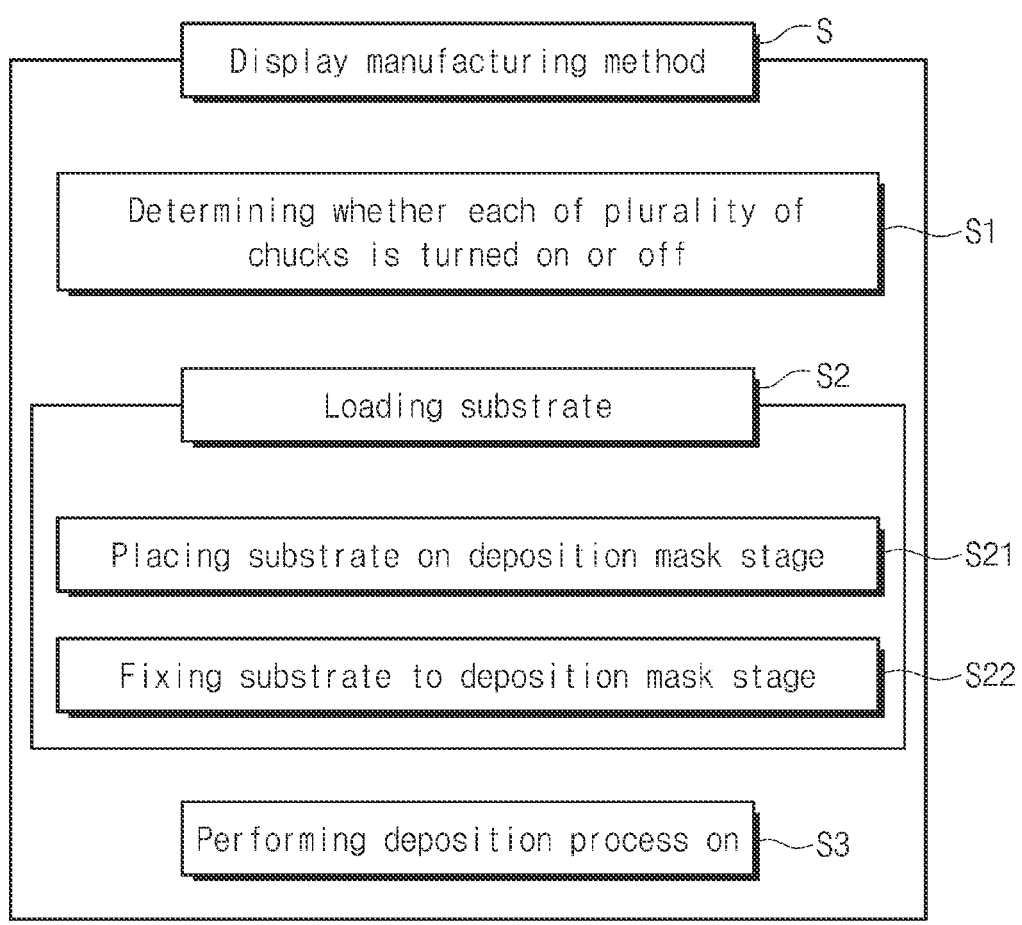
FIG. 12 schematically illustrates a flow chart showing a display manufacturing method according to an embodiment of the disclosure.

FIG. 12 schematically illustrates a flow chart showing a display manufacturing method according to an embodiment of the disclosure.

Referring to FIG. 12, a display manufacturing method S may be provided. The display manufacturing method S may use the display manufacturing apparatus A discussed with reference to FIGS. 1 to 11 may be utilized to fabricate displays. The display manufacturing method S may include a step S1 of determining whether each of multiple chucks is turned on or off, a step S2 of loading a substrate, and a step S3 of performing a deposition process on the substrate.

The substrate loading step S2 may include a step S21 of placing the substrate on a deposition mask stage and a step S22 of fixing the substrate to the deposition mask stage.

With reference to FIGS. 13 to 21, the following will describe in detail the display manufacturing method S of FIG. 12.

FIGS. 13 to 21 schematically illustrate diagrams showing a display manufacturing method in accordance with the flow chart of FIG. 12.

Figure 13:
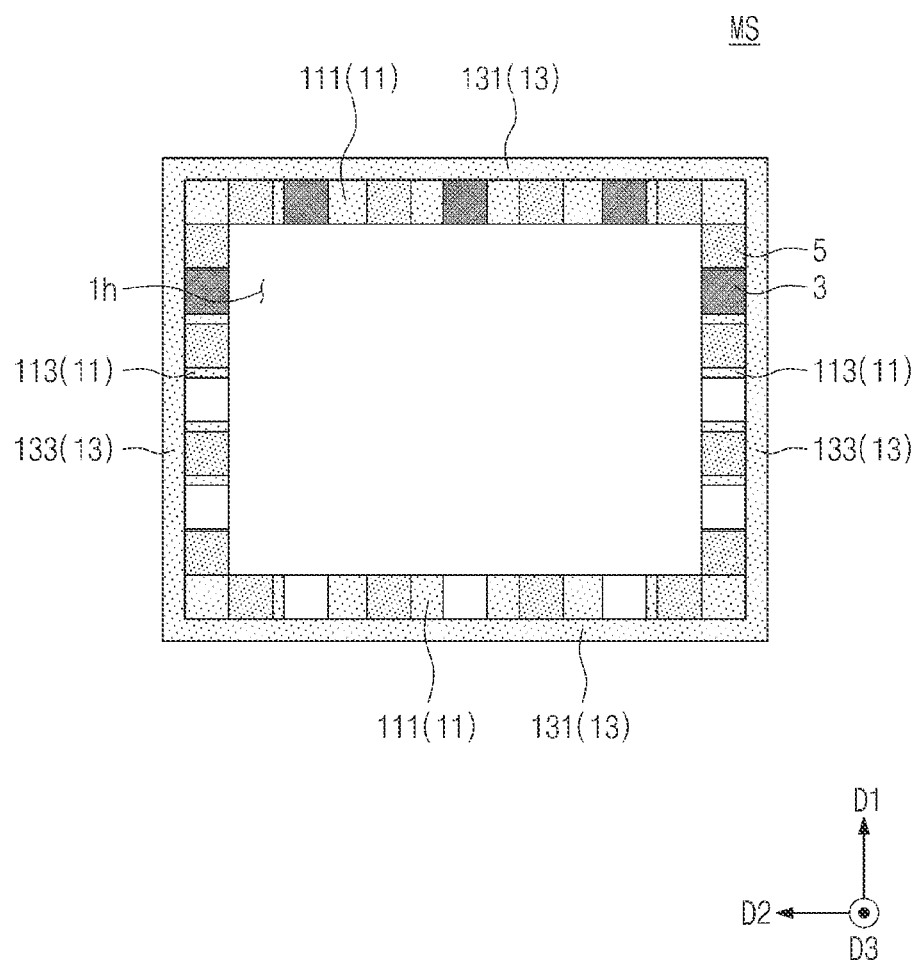
FIGS. 13 to 21 schematically illustrate diagrams showing a display manufacturing method in accordance with the flow chart of FIG. 12.
Figure 14:
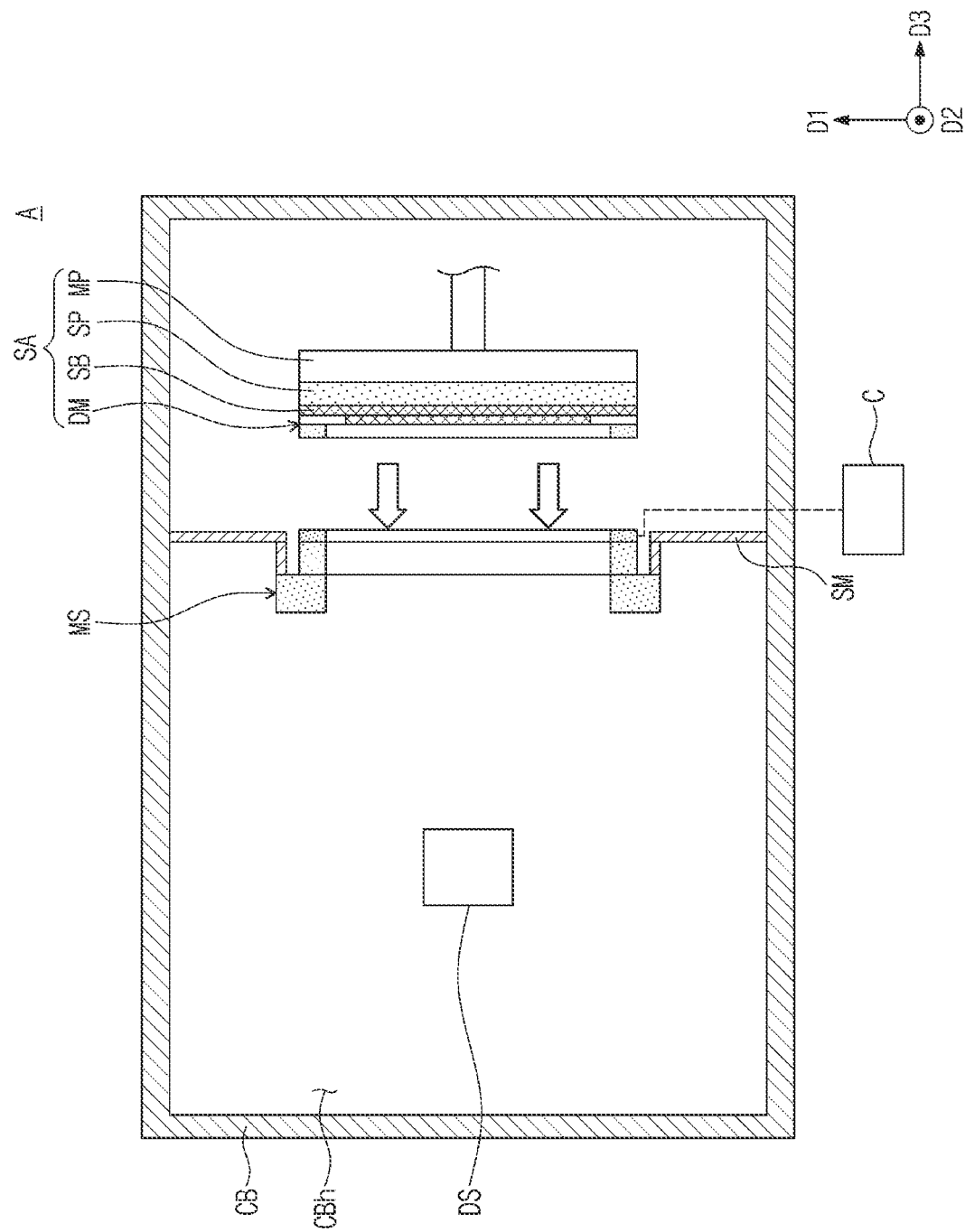
Figure 15:
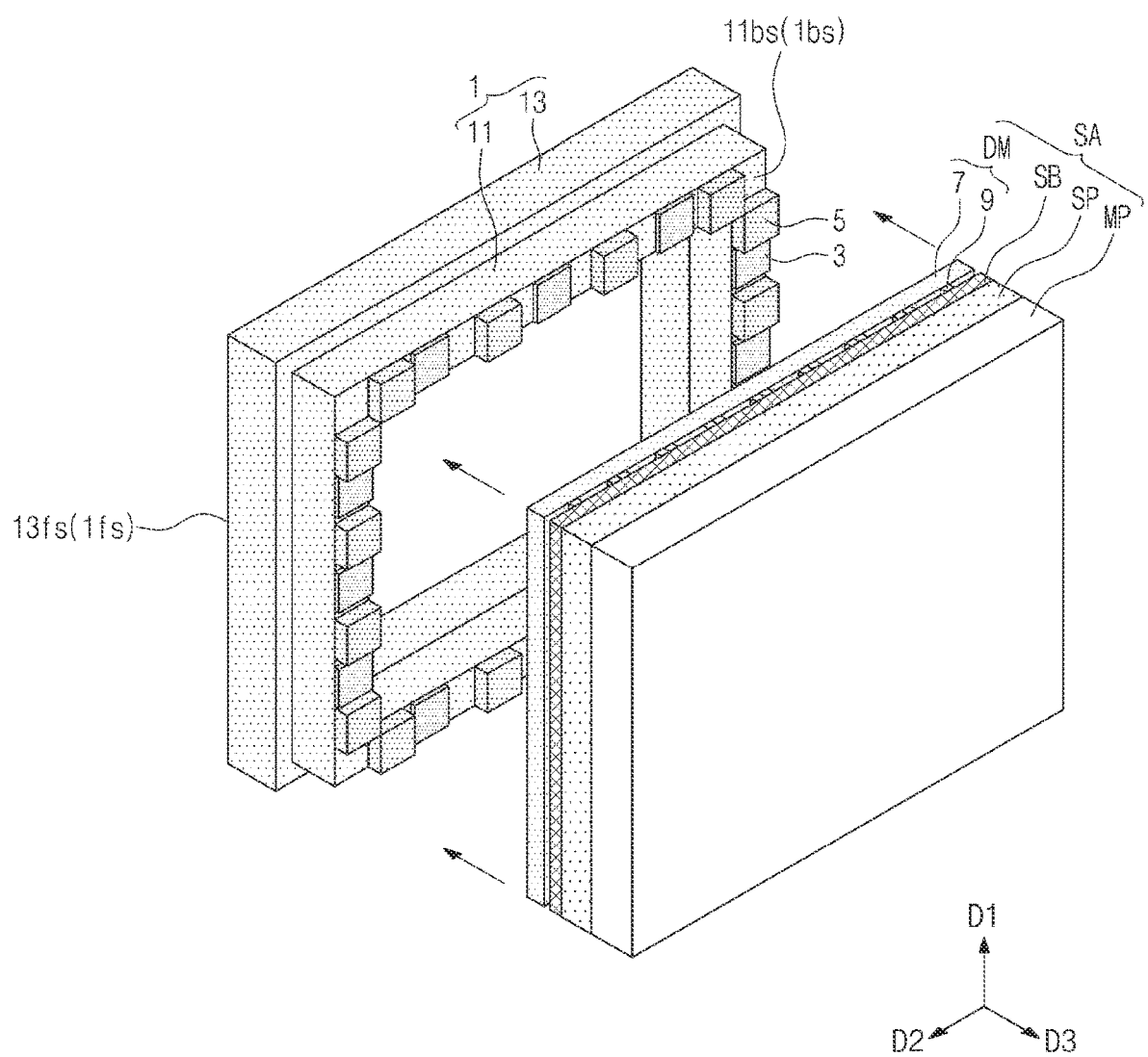
Figure 16:
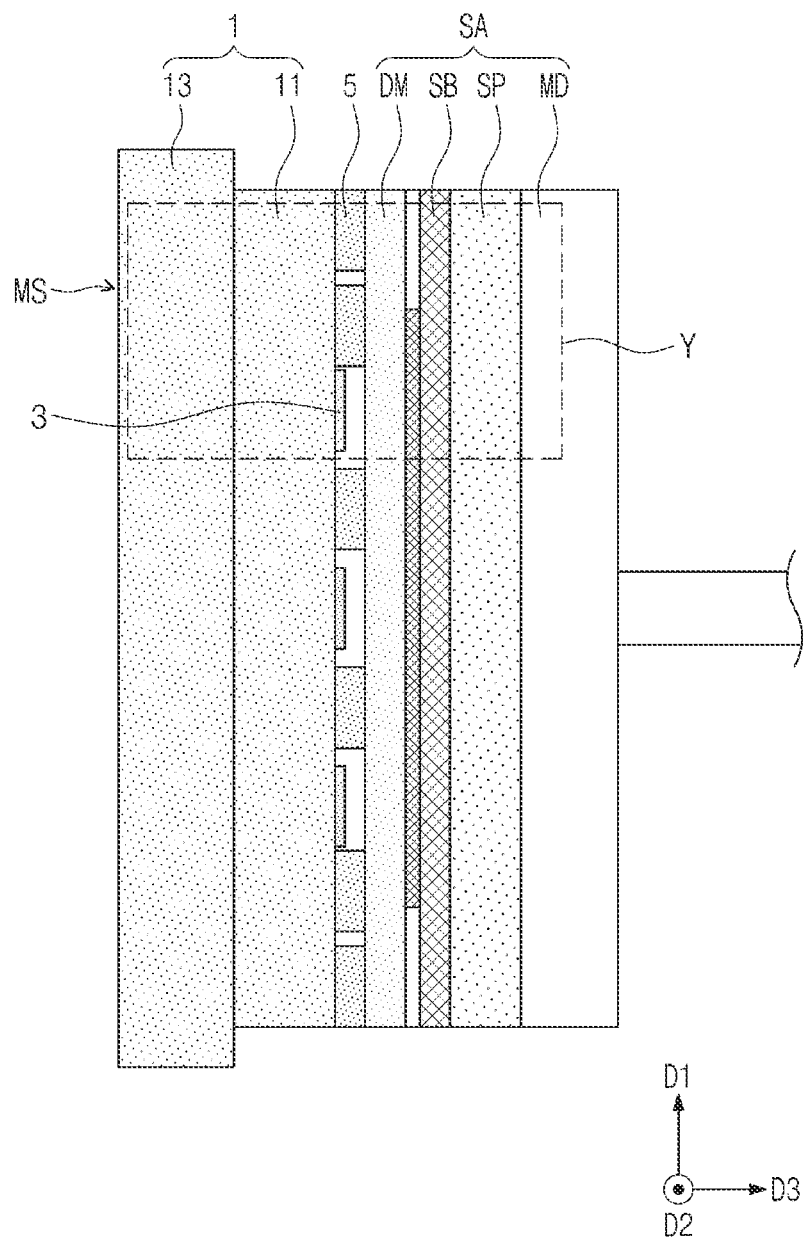
Figure 17:
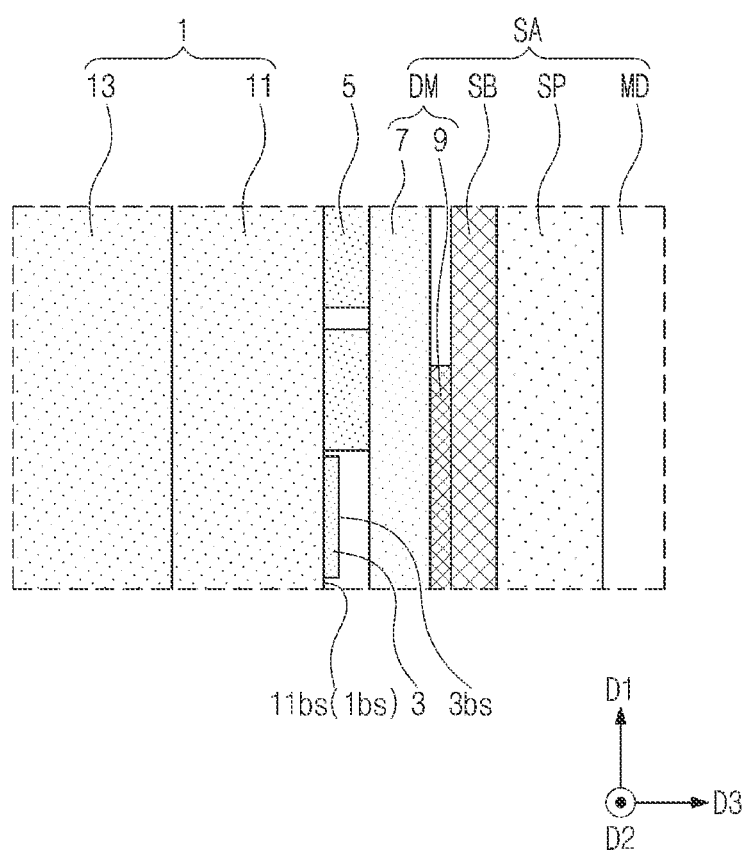

Referring to FIGS. 12 and 13, the chuck determination step S1 may include a step of classifying types of deposition masks and a step of determining which one of the chucks is turned off for each type of deposition mask. In the classification step, deposition masks having various sizes and shapes may be classified in accordance with the type of deposition mask. In the determination step, it may be possible to determine which one of the chucks 3 should be turned on or off based on an appropriate type. For example, as shown in FIG. 13, five chucks 3 at an upper side may be turned on, and seven chucks 3 at a lower side may be turned off. The turned on/off state of a chuck 3 may be changed in accordance with detailed design considerations. This will be applied for each type of the deposition mask DM.

Referring to FIGS. 12 and 14 to 17, the substrate placement step S21 may include allowing the substrate assembly SA to move to rest on the deposition mask stage MS in the chamber CB. The substrate assembly SA may be in a state that the deposition mask DM, the substrate SB, the support plate SP, and the fixing plate MP may be sequentially disposed. For example, the substrate SB may be transferred into the chamber CB in a state that the back side (see SBbs of FIG. 3) of the substrate SB is attached to the support plate SP. The substrate placement step S21 may include a step of allowing a front side of the deposition mask DM to contact the deposition mask stage MS. The deposition mask DM connected to the front side (see SBfs of FIG. 3) of the substrate SB may contact the deposition mask stage MS so as to allow the front side SBfs of the substrate SB to face toward the deposition source DS. For example, the front side of the deposition mask DM may contact the back side (see 5bs of FIG. 8) of the support block 5. The back side 3bs of the chuck 3 may not contact the deposition mask DM.

Figure 18:
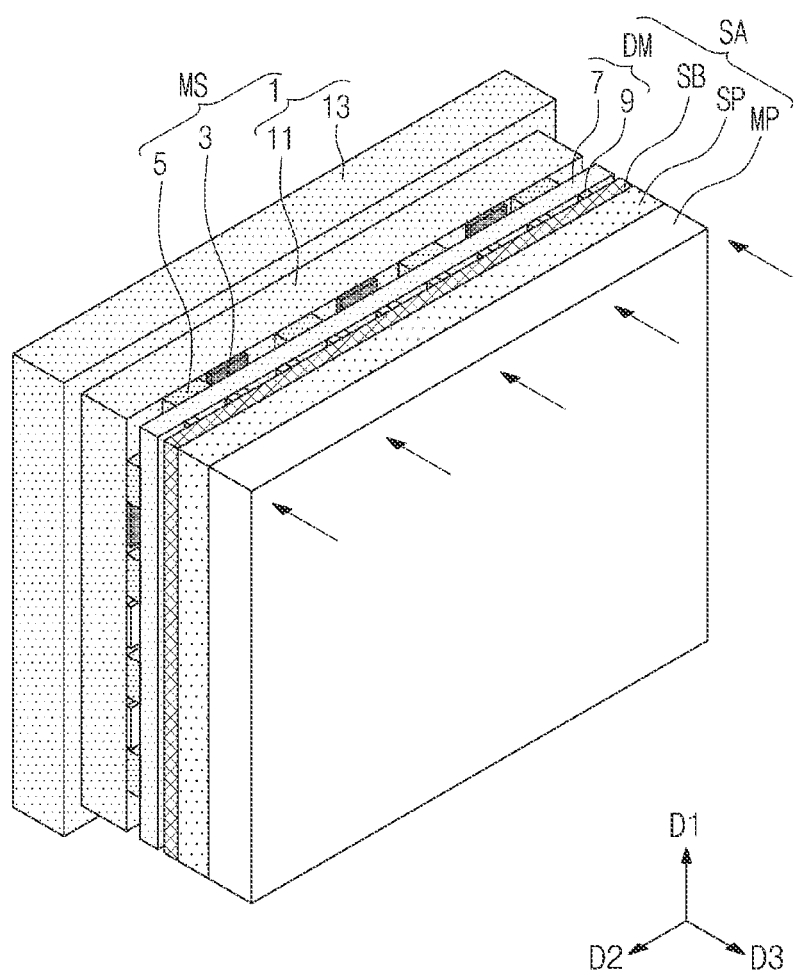

Referring to FIGS. 12 and 18, the substrate fixing step S22 may include allowing the chuck 3 to fix the deposition mask DM to the deposition mask stage MS. For example, the magnetic force provided from the chuck 3 may cause the deposition mask DM to fix on the deposition mask stage MS. As the deposition mask DM may be fixed to the deposition mask stage MS, the substrate SB connected to the deposition mask DM may be fixed to the deposition mask stage MS. The substrate fixing step S22 may include turning on certain of the chucks 3 and turning off remaining chucks 3. For example, as shown in FIG. 13, five chucks 3 at an upper side may be turned on, and seven chucks 3 at a lower side may be turned off. A magnetic force may be provided from the five chucks 3 turned-on at the upper side. Therefore, an upper side of the deposition mask DM may be relatively strongly in close contact with the deposition mask stage MS. A lower side of the deposition mask DM may be relatively weakly in close contact with the deposition mask stage MS or may not be in contact with the deposition mask stage MS. Therefore, the deposition mask DM may slightly change in shape. In case that certain of the chucks 3 are turned on, and in case that remaining chucks 3 are turned off, it may be possible to intentionally change the shape of the deposition mask DM that may be fixed to the deposition mask stage MS. As a result, the shape of the deposition mask DM may be controlled and corrected as needed.

Figure 19:
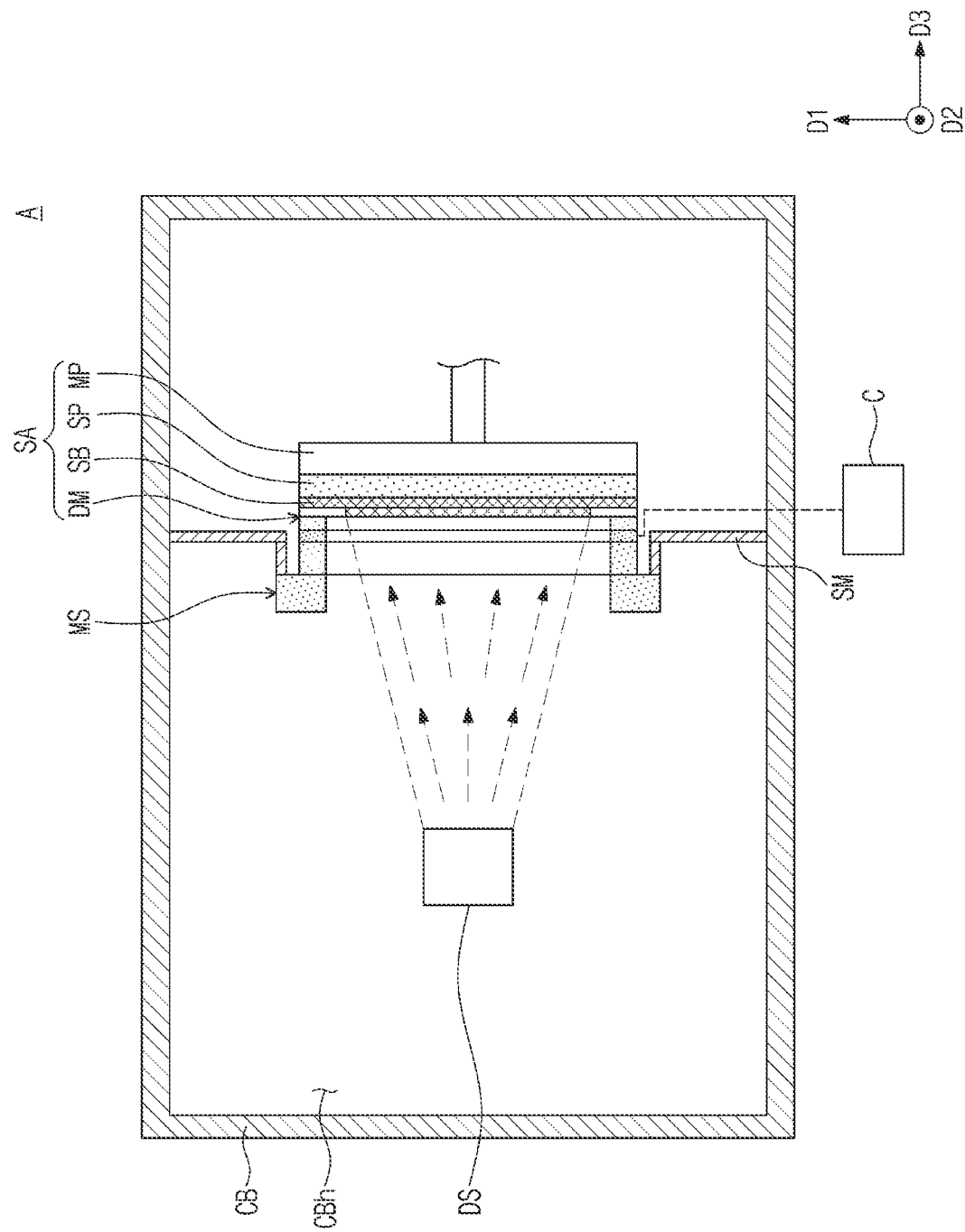

Referring to FIG. 19, the deposition step S3 may include allowing the deposition source DS to spray a deposition material. The deposition material may arrive at the substrate SB after passing through the deposition mask stage MS and the deposition mask DM. The deposition material may be patterned while passing through the deposition mask DM. Therefore, the patterned deposition material may be formed on the substrate SB.

Figure 20:
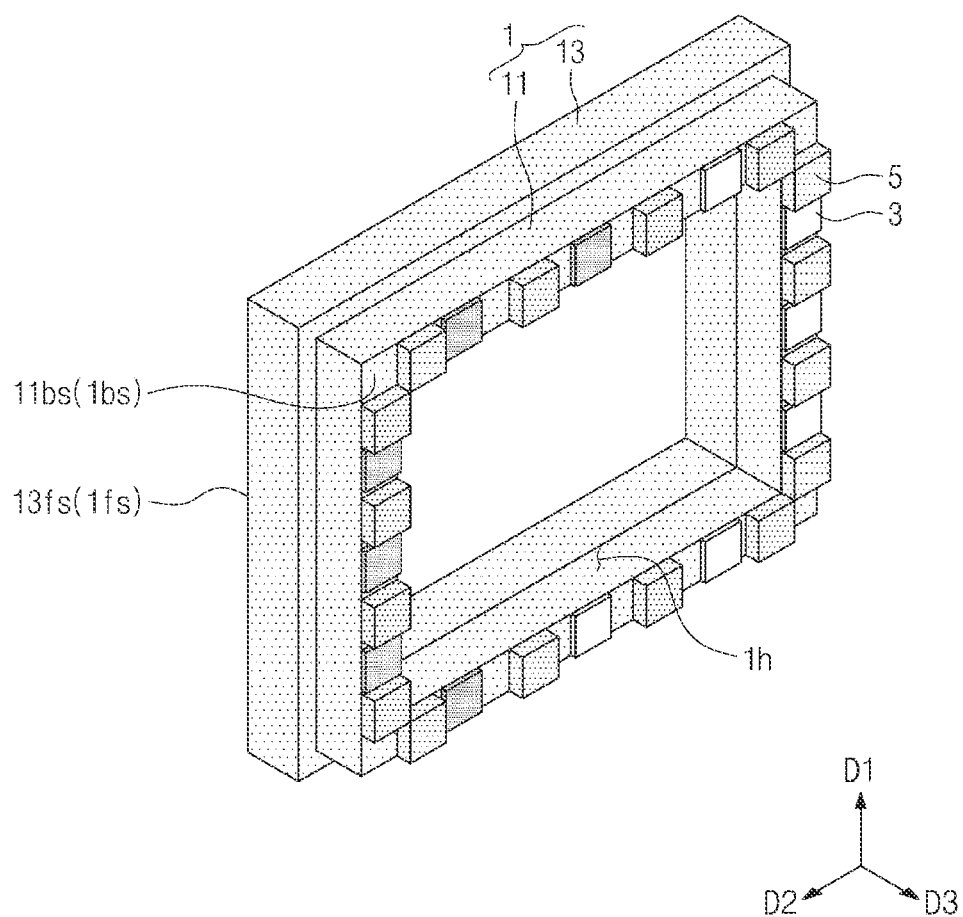

Referring to FIGS. 12 and 20, there may be a change in the determination of whether each of the multiple chucks 3 is turned on or off (e.g., determining which of the chucks 3 are turned on or off). For example, differently from that discussed with reference to FIG. 13, six chucks at a left side may be turned on, and six chucks at a right side may be turned off. In other embodiments, others of the chucks 3 may be determined to be turn on or off (e.g., in other modes different from that shown in the drawings).

Figure 21:
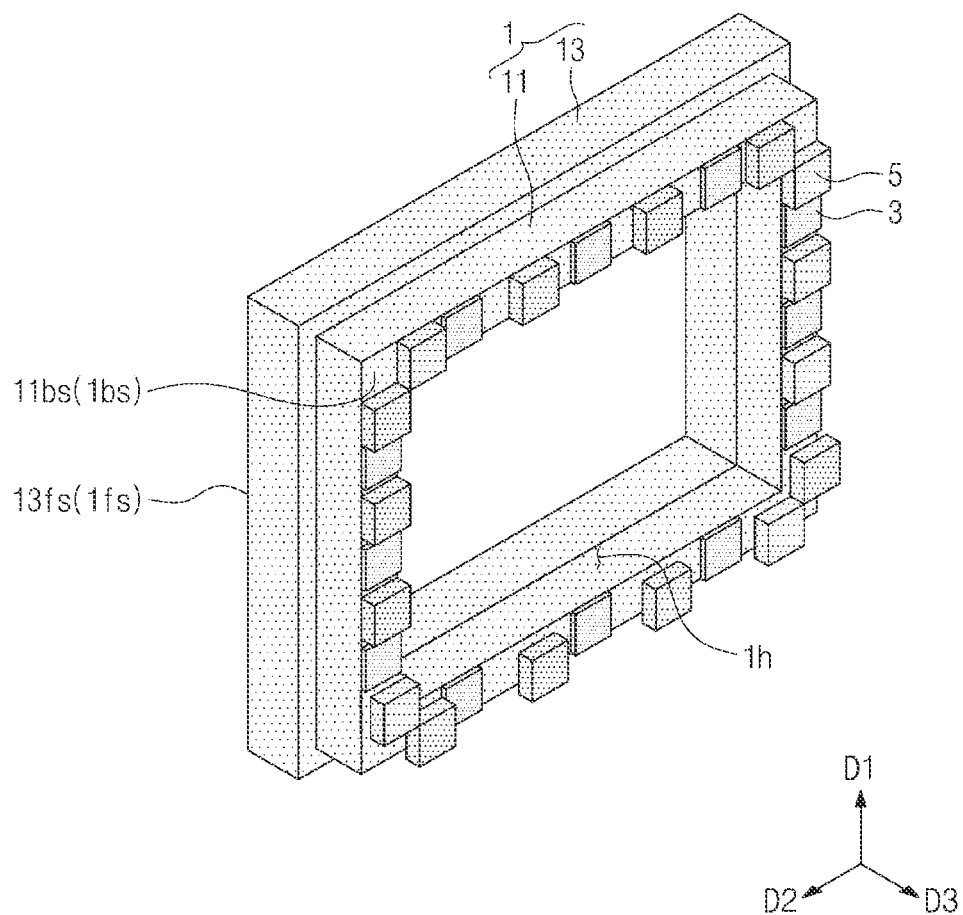

Referring to FIG. 21, the substrate loading step S2 may further include a step of adjusting a distance between the back side (see 5*bs* of FIG. 8) of the support block 5 and the back side 1*bs* of the stage frame 1. In this stage, the position adjustment device (see 4 of FIG. 8) may be used to adjust a position of the support block 5, and this may adjust a distance between the back side (see 5*bs* of FIG. 8) of the support block 5 and the back side 1*bs* of the stage frame 1. For example, as shown in FIG. 21, six support blocks 5 at a lower side may protrude backwardly. It may thus be possible to control a shape of the deposition mask DM that may be fixed to the deposition mask stage MS. For example, the shape of the deposition mask DM may be controlled by using two forces, an attractive force provided from the chuck 3 and a repulsive force provided from the support block 5.

It is described that the deposition mask stage MS is used in a deposition apparatus, but the disclosure is not limited thereto. For example, the deposition mask stage MS of the disclosure may be used in a welding machine. For example, a mask welding machine for manufacturing the deposition mask DM may use the deposition mask stage MS for fixing the mask frame 7.

According to a deposition mask stage, a display manufacturing apparatus including the same, and a display manufacturing method using the same in accordance with an embodiment of the disclosure, a shape of a deposition mask may be controlled during a deposition process. For example, in case that the shape of the deposition mask is distorted due to a load of the deposition mask, chucks may be independently controlled to correct the deposition mask to have its initial shape. Support blocks may be separately controlled to correct the shape of the deposition mask. Accordingly, substrate deposition processes may increase in yield.

According to a deposition mask stage, a display manufacturing apparatus including the same, and a display manufacturing method using the same in accordance with an embodiment of the disclosure, chucks and/or support blocks may be independently controlled to differently control various shapes of deposition masks fixed to a deposition mask stage. In conclusion, it may be possible to correct the shapes in correspondence with various kinds of deposition masks.

Figure 22:
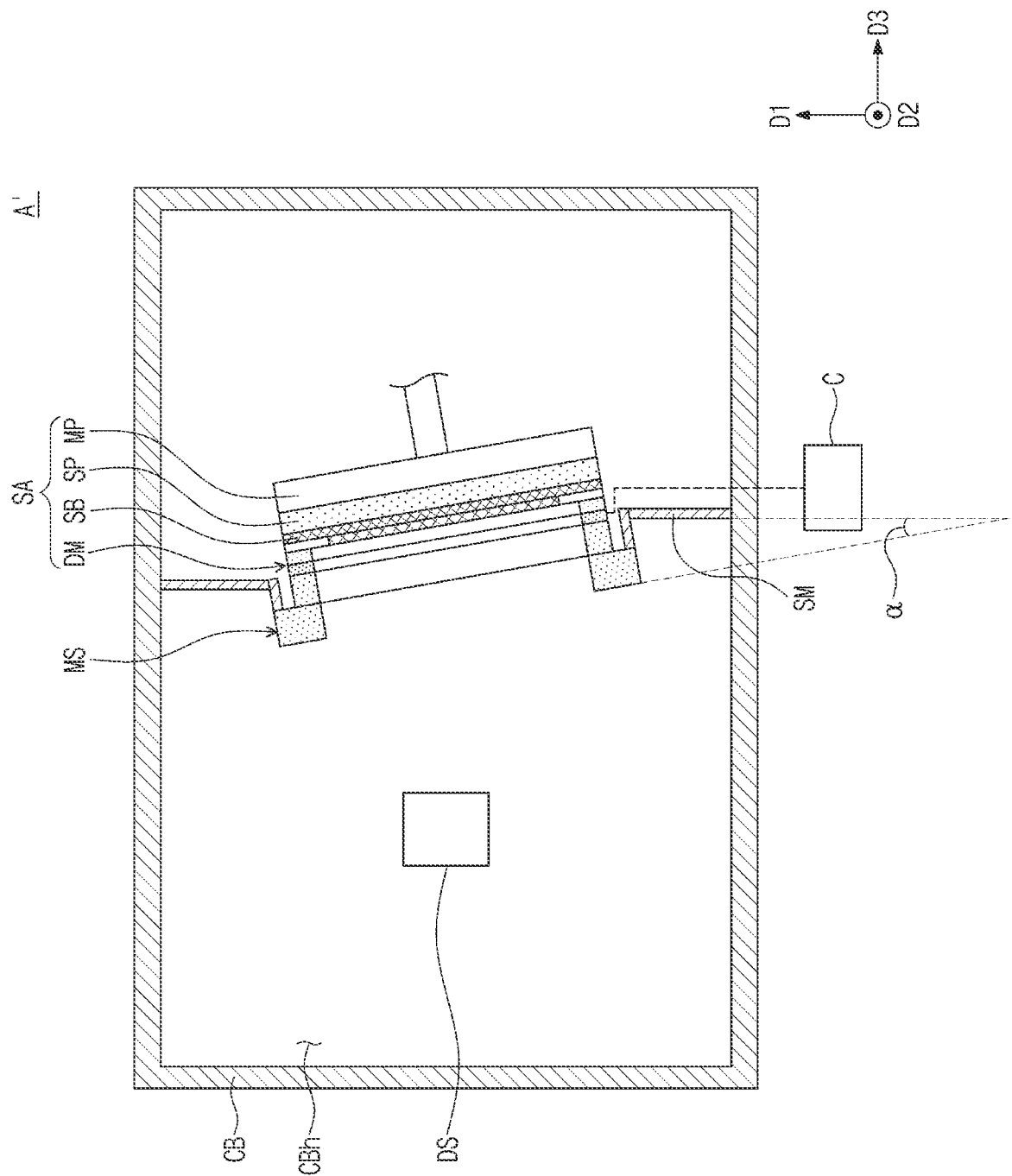
FIG. 22 schematically illustrates a cross-sectional view showing a display manufacturing apparatus according to an embodiment of the disclosure.

FIG. 22 schematically illustrates a cross-sectional view showing a display manufacturing apparatus according to an embodiment of the disclosure.

The following may omit a description of contents substantially the same as or similar to that discussed with reference to FIGS. 1 to 21.

Referring to FIG. 22, a display manufacturing apparatus A' may be provided. Differently from the description with reference to FIG. 1, the deposition mask stage MS may be forwardly inclined in the display manufacturing apparatus A' of FIG. 22. For example, the deposition mask stage MS may be forwardly inclined to form a first angle $\alpha$ relative to the first direction D1. The first angle $\alpha$ may range from about 1° to about 10°, but the disclosure is not limited thereto.

Figure 23:
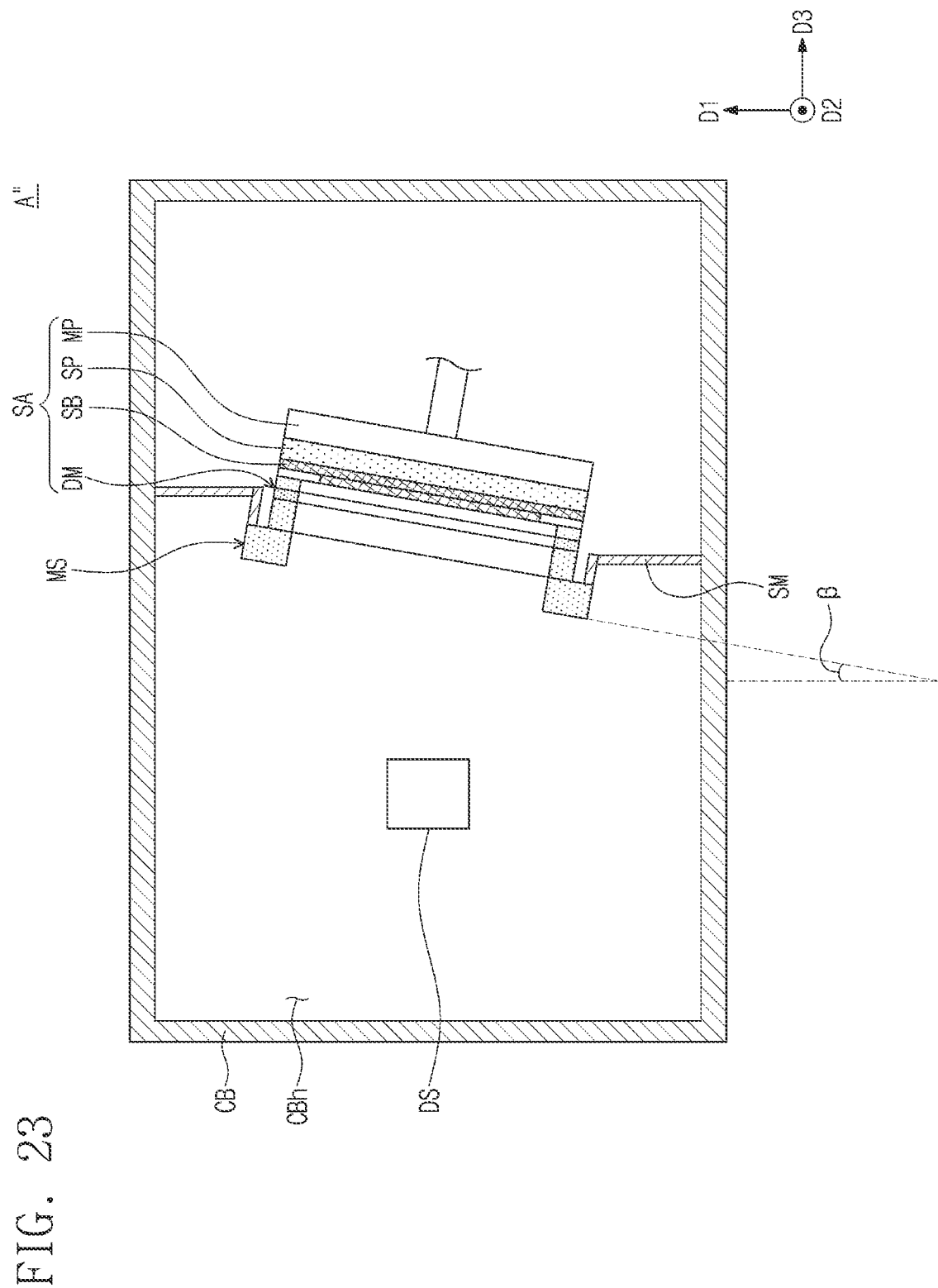
FIG. 23 schematically illustrates a cross-sectional view showing a display manufacturing apparatus according to an embodiment of the disclosure.

FIG. 23 schematically illustrates a cross-sectional view showing a display manufacturing apparatus according to an embodiment of the disclosure.

The following may omit a description of contents substantially the same as or similar to that discussed with reference to FIGS. 1 to 22.

Referring to FIG. 23, a display manufacturing apparatus A" may be provided. Differently from the description with reference to FIG. 1, the deposition mask stage MS may be backwardly inclined in the display manufacturing apparatus A" of FIG. 23. For example, the deposition mask stage MS may be backwardly inclined to form a second angle $\beta$ relative to the first direction D1. The second angle $\beta$ may range from about 1° to about 10°, but the disclosure is not limited thereto.

Figure 24:
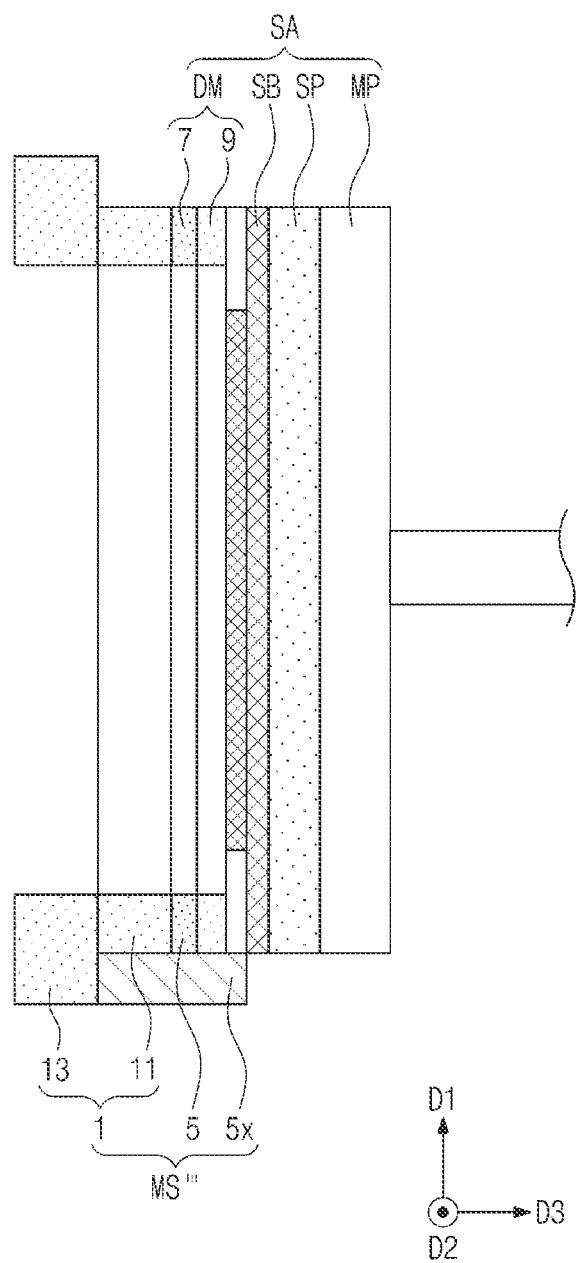
FIG. 24 schematically illustrates a cross-sectional view showing a display manufacturing apparatus according to an embodiment of the disclosure.

FIG. 24 schematically illustrates a cross-sectional view showing a display manufacturing apparatus according to an embodiment of the disclosure.

The following may omit a description of contents substantially the same as or similar to that discussed with reference to FIGS. 1 to 23.

Referring to FIG. 24, a deposition mask stage MS''' may further include a lower support block 5*x*. The lower support block 5*x* may be positioned below the first frame 11. For example, in a state that the substrate assembly SA may be combined with the deposition mask stage MS''', the lower support block 5*x* may be combined with the second frame 13 so as to be positioned below the deposition mask DM. The lower support block 5*x* may support a load of the substrate assembly SA.

According to a deposition mask stage, a display manufacturing apparatus including the same, and a display manufacturing method using the same in accordance with an embodiment of the disclosure, it may be possible, if necessary, to change a shape of a deposition mask during a deposition process.

According to a deposition mask stage, a display manufacturing apparatus including the same, and a display manufacturing method using the same in accordance with an embodiment of the disclosure, it may be possible to correct shapes of various types of deposition mask by obtaining in advance the degree of requirement for shape correction based on types of deposition mask.

According to a deposition mask stage, a display manufacturing apparatus including the same, and a display manufacturing method using the same in accordance with an embodiment of the disclosure, a shape of a deposition mask may be controlled to increase a deposition process yield.

Although the embodiments have been described with reference to a number of illustrative examples thereof, it will be understood by those of ordinary skill in the art that various changes in form and details may be made without departing from the spirit and scope of the disclosure. Thus, the technical scope of the disclosure is not limited by the embodiments and examples described above.

What is claimed is:

1. A deposition mask stage, comprising:
a stage frame;
chucks combined with the stage frame; and
support blocks on a back side of the stage frame, wherein
the chucks are spaced apart from each other in a first direction and a second direction that are defined in an extending direction of the stage frame, the first and second directions intersecting each other, and
the support blocks are spaced apart from each other in the first direction and the second direction on the back side of the stage frame.

2. The deposition mask stage of claim 1, wherein each of the chucks includes a permanent magnetic chuck.

3. The deposition mask stage of claim 1, further comprising:
a position adjustment device combined with each of the support blocks, the position adjustment device adjusting a position of each of the support blocks.

4. The deposition mask stage of claim 1, wherein each of the chucks is spaced apart from each of the support blocks.

5. The deposition mask stage of claim 1, wherein each of the chucks is disposed on the back side of the stage frame.

6. The deposition mask stage of claim 5, wherein a distance between a back side of each of the support blocks and the back side of the stage frame is greater than a distance between a back side of each of the chucks and the back side of the stage frame.

7. A display manufacturing apparatus, comprising:
a deposition source; and
a deposition mask stage spaced apart from the deposition source,
wherein the deposition mask stage includes:
a stage frame; and
at least one chuck physically connected to the stage frame.

8. The display manufacturing apparatus of claim 7, wherein the at least one chuck is disposed opposite to the deposition source with the stage frame between the at least one chuck and the deposition source.

9. The display manufacturing apparatus of claim 7, wherein the deposition mask stage is spaced in a horizontal direction from the deposition source.

10. The display manufacturing apparatus of claim 9, wherein
the at least one chuck comprises a plurality of chucks, and the plurality of chucks are spaced apart from each other in direction that intersects the horizontal direction.

11. The display manufacturing apparatus of claim 7, wherein
the deposition mask stage further includes a support block physically connected to the stage frame,
the stage frame has a front side directed toward the deposition source and a back side opposite to the front side, and
the support block is disposed on the back side of the stage frame.

12. The display manufacturing apparatus of claim 7, wherein the at least one chuck includes a permanent magnetic chuck.

13. The display manufacturing apparatus of claim 12, further comprising a chuck power supply that supplies the permanent magnetic chuck with power.

14. A display manufacturing method, the method comprising:
loading a substrate on a display manufacturing apparatus; and
using a deposition source of the display manufacturing apparatus to perform a deposition process on the substrate, wherein
the loading of the substrate on the display manufacturing apparatus includes:
placing the substrate on a deposition mask stage of the display manufacturing apparatus; and
using at least one chuck of the deposition mask stage to fix the substrate to the deposition mask stage, and
the placing of the substrate on the deposition mask stage includes allowing a deposition mask to contact the deposition mask stage such that a front side of the substrate faces toward the deposition source, and the deposition mask is physically connected to the front side of the substrate.

15. The display manufacturing method of claim 14, wherein
the at least one chuck comprises a plurality of chucks,
wherein the fixing of the substrate to the deposition mask stage includes turning on at least one of the plurality of chucks and turning off remaining ones of the plurality of chucks.

16. The display manufacturing method of claim 15, further comprising determining whether each of the plurality of chucks is turned off.

17. The display manufacturing method of claim 16, wherein the determining whether each of the plurality of chucks is turned off includes:
classifying types of the deposition mask; and
determining which of the plurality of chucks is turned off for each type of the deposition mask.

18. The display manufacturing method of claim 14, wherein
the deposition mask stage includes:
a stage frame; and
a support block on a back side of the stage frame, and
the allowing of the deposition mask to contact the deposition mask stage includes allowing a front side of the deposition mask to contact a back side of the support block.

19. The display manufacturing method of claim 18, wherein the loading of the substrate on the display manufacturing apparatus includes adjusting a distance between the back side of the support block and the back side of the stage frame.

20. The display manufacturing method of claim 14, wherein the placing of the substrate on the deposition mask stage includes transferring the substrate into a chamber of the display manufacturing apparatus in a state that a back side of the substrate is fixed to a support plate.

\* \* \* \* \*